United States Patent
Koresawa

(10) Patent No.: US 9,917,144 B2
(45) Date of Patent: Mar. 13, 2018

(54) DISPLAY PANEL AND METHOD FOR MANUFACTURING SAME

(71) Applicant: JOLED INC., Tokyo (JP)

(72) Inventor: Kouhei Koresawa, Kyoto (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/508,395

(22) PCT Filed: Aug. 27, 2015

(86) PCT No.: PCT/JP2015/004325
§ 371 (c)(1),
(2) Date: Mar. 2, 2017

(87) PCT Pub. No.: WO2016/035296
PCT Pub. Date: Mar. 10, 2016

(65) Prior Publication Data
US 2017/0287984 A1     Oct. 5, 2017

(30) Foreign Application Priority Data

Sep. 3, 2014   (JP) ................................. 2014-179044

(51) Int. Cl.
*H01L 21/00*     (2006.01)
*H01L 27/32*     (2006.01)
(Continued)

(52) U.S. Cl.
CPC ........ *H01L 27/322* (2013.01); *H01L 27/3246* (2013.01); *H01L 51/0541* (2013.01);
(Continued)

(58) Field of Classification Search
CPC ... H01L 51/0541; H01L 51/56; H01L 51/545; H01L 27/322; H01L 27/3246;
(Continued)

(56) References Cited

U.S. PATENT DOCUMENTS

| 5,443,922 A | 8/1995 | Nishizaki et al. |
| 2012/0207991 A1 | 8/2012 | Arai et al. |

(Continued)

FOREIGN PATENT DOCUMENTS

| JP | 05-163488 A | 6/1993 |
| JP | 2003-109750 A | 4/2003 |

(Continued)

*Primary Examiner* — Thinh T Nguyen
(74) *Attorney, Agent, or Firm* — Chip Law Group

(57) ABSTRACT

A display panel includes an EL panel section, a CF panel section, and a sealing resin layer. In the EL panel section, the surface of a sealing layer has a projected and recessed shape in a Z-axis direction as a whole, wherein a light-emitting region corresponding to a region between banks is a recessed section, and a non-light-emitting region corresponding to a top portion of the bank is a projected section. The sealing resin layer includes a first sealing resin layer and a second sealing resin layer. Prior to performing heating or light irradiation in a step of forming the first and second sealing resin layers, the viscosity of a second non-fluid resin constituting the second sealing resin layer is lower than the viscosity of a first non-fluid resin constituting the first sealing resin layer.

10 Claims, 14 Drawing Sheets

(51) Int. Cl.
*H01L 51/05* (2006.01)
*H01L 51/56* (2006.01)

(52) U.S. Cl.
CPC ...... *H01L 27/3244* (2013.01); *H01L 51/0545* (2013.01); *H01L 51/56* (2013.01); *H01L 2227/323* (2013.01)

(58) Field of Classification Search
CPC ............ H01L 2227/323; H01L 51/524; H01L 27/3211; H01L 51/5275
USPC ........ 438/82, 99, 28, 29; 257/40, 89, 59, 88, 257/E21.007
See application file for complete search history.

(56) References Cited

U.S. PATENT DOCUMENTS

| | | | |
|---|---|---|---|
| 2012/0217521 A1* | 8/2012 | Ohta | .................. H01L 51/5275 257/89 |
| 2013/0026907 A1 | 1/2013 | Okumura et al. | |
| 2014/0027798 A1 | 1/2014 | Sato et al. | |

FOREIGN PATENT DOCUMENTS

| | | |
|---|---|---|
| JP | 2007-200692 A | 8/2007 |
| JP | 2009-271470 A | 11/2009 |
| JP | 2010-237384 A | 10/2010 |
| JP | 2014-013684 A | 1/2014 |
| JP | 2014-026831 A | 2/2014 |
| WO | 2011027815 A1 | 3/2011 |
| WO | 2013001583 A1 | 1/2013 |

* cited by examiner

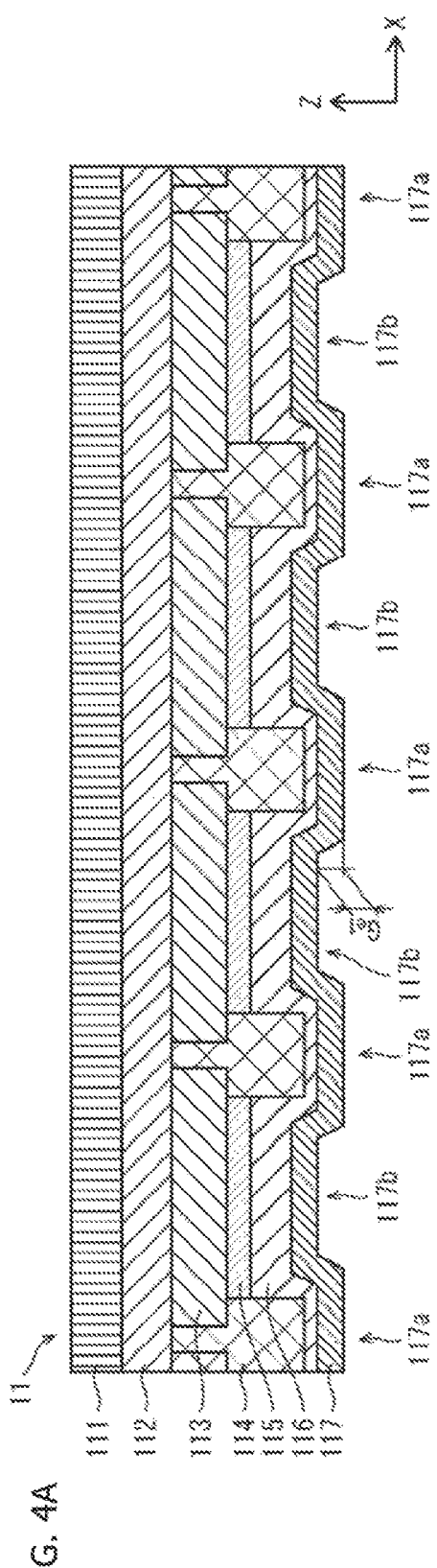
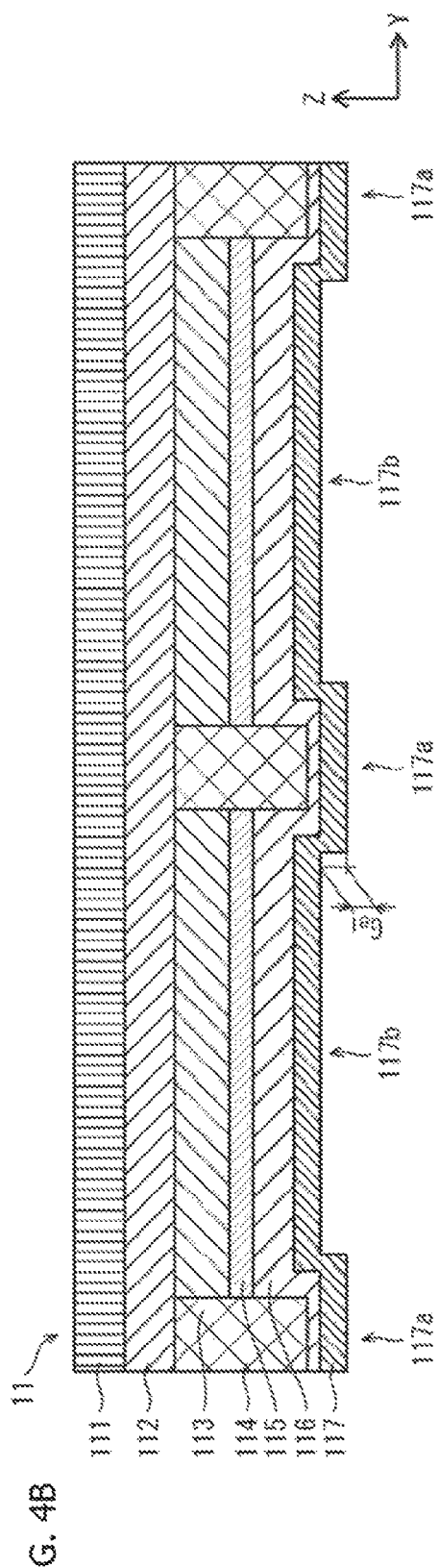

FIG. 7A
FIG. 7B
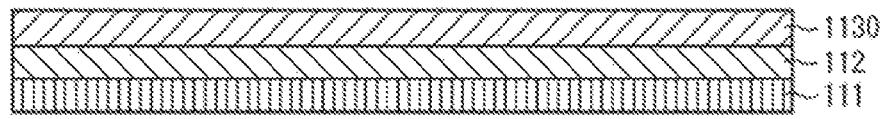
FIG. 7C
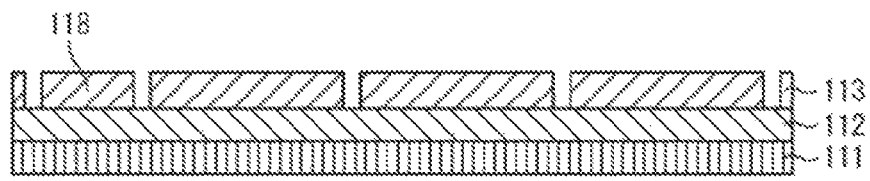
FIG. 7D
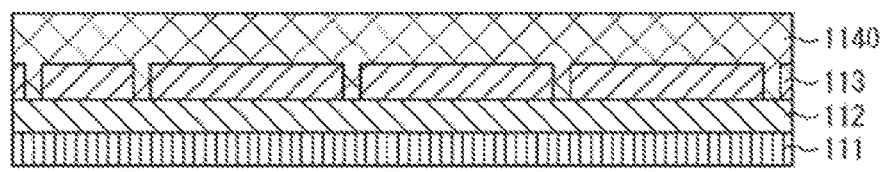
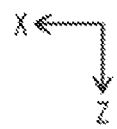

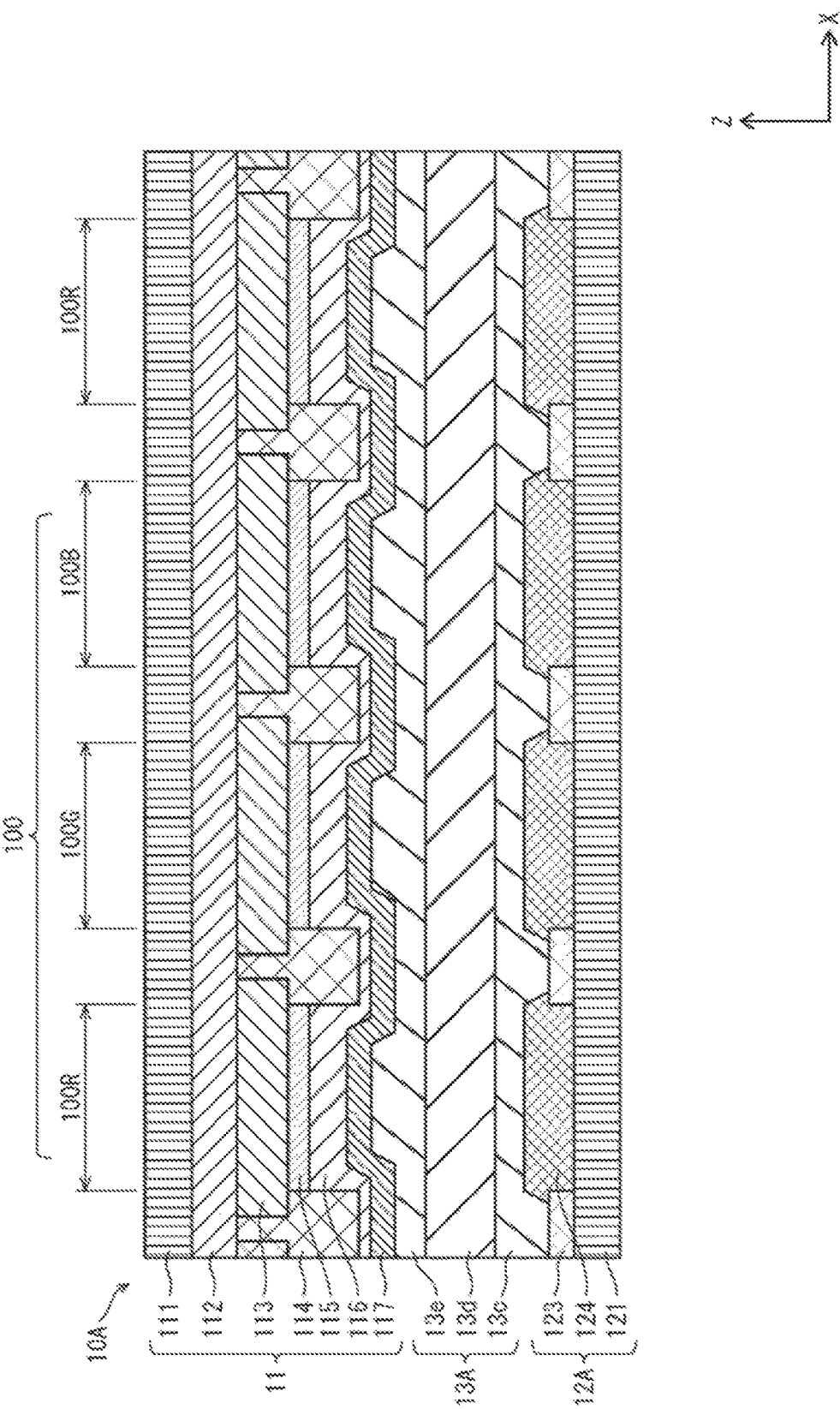

DISPLAY PANEL AND METHOD FOR MANUFACTURING SAME

CROSS REFERENCE TO RELATED APPLICATIONS

This application is a U.S. National Phase of International Patent Application No. PCT/JP2015/004325 filed on Aug. 27, 2015, which claims priority benefit of Japanese Patent Application No. JP 2014-179044 filed in the Japan Patent Office on Sep. 3, 2014. Each of the above-referenced applications is hereby incorporated herein by reference in its entirety.

TECHNICAL FIELD

The present invention relates to a display panel and a method of manufacturing the same.

BACKGROUND ART

In recent years, research and development of an organic electroluminescence (EL) display panel, which is a display panel utilizing an electroluminescence phenomenon of organic material, have been energetically made. The organic EL display panels are superior to liquid crystal display panels and the like in terms of high-speed response, low power consumption, small thickness and weight, and high contrast, and are expected as high-performance display panels.

An organic EL display panel has an organic EL panel section and a color filter (CF) panel section which are disposed to face each other. Of the two panel sections, the organic EL panel section includes a substrate formed with a thin film transistor (TFT) layer, and a laminate of anode/hole injection layer/hole transport layer/organic light-emitting layer/electron transport layer/cathode/sealing layer, the laminate being formed over the substrate. In addition, banks for partitioning the organic light-emitting layers in adjacent light-emitting regions from each other are formed over the substrate.

On the other hand, the CF panel section has a configuration wherein color filter layers corresponding to each of light-emitting regions are formed over a substrate, and the adjacent color filter layers are partitioned by a black matrix layer.

In the organic EL display panel, the EL panel section and the CF panel section are disposed to face each other in such a manner that a main surface on the side where the stacked body is formed and a main surface on the side where the color filter layers and the like are formed face each other, with a resin layer interposed therebetween. As the resin layer, one having a sealing performance is used for the purpose of, for example, restraining penetration of moisture into the EL panel section (PTL 1).

In addition, for restraining gas bubbles from remaining in the resin layer, a technology of forming the resin layer by use of a non-fluid resin has been proposed (PTL 2). Here, the non-fluid resin is a resin which does not have fluidity in the state of being not yet treated by heating or light irradiation or the like. In adhering the panel sections to each other by use of the resin, the EL panel section and the CF panel section are adhered to each other with the non-fluid resin sandwiched therebetween, and thereafter the resin is heated or irradiated with light to impart fluidity to the resin, followed by curing the resin.

CITATION LIST

Patent Literatures

[PTL 1]
    PCT Patent Publication No. WO2013/001583
[PTL 2]
    PCT Patent Publication No. WO2011/027815

SUMMARY

Technical Problem

However, in the technology proposed in PTL 2, after the adhesion of the EL panel section and the CF panel section to each other, film exfoliation may occur on the surface side in light-emitting regions of the EL panel section. At a part where such film exfoliation is generated, a lowering in luminance may be generated, or a non-light-emitting state may be generated.

Note that the above-mentioned problem is not limited to the organic EL display panels, but may be generated in the same manner in any display panel that has a configuration wherein two panel sections are disposed to face each other, with a resin layer interposed therebetween. In addition, with respect to the resin interposed between the panel sections, the above problem is generated conspicuously in the case where the non-fluid resin introduced in PTL 2 is used; it is considered, however, that the same or similar problem would occur in the case where a phenomenon of flow is generated between two panel sections.

In order to solve the above-mentioned problem, there are provided a method of manufacturing a display panel, and the display panel, wherein generation of film exfoliation arising from flow of resin in adhering two panel sections to each other is restrained, and high display quality is obtained.

Solution to Problem

A method of manufacturing a display panel according to one mode of the present invention includes: a step of preparing a first panel section of which a first main surface as a one-side main surface has a projected and recessed shape; a step of preparing a second panel section; a step of disposing a sheet-shaped first non-fluid resin in such a manner that a one-side main surface thereof makes contact with a second main surface as a one-side main surface of the second panel section; a step of disposing a sheet-shaped second non-fluid resin in such a manner that a one-side main surface thereof makes contact with an other-side main surface of the first non-fluid resin; a step of disposing the first panel section in such a manner that the first main surface of the first panel section makes contact with an other-side main surface of the second non-fluid resin; and a step of subjecting the first and second non-fluid resins to heating or light irradiation to impart fluidity to the resins and thereafter curing the resins to thereby form first and second sealing resin layers respectively from the first and second non-fluid resins, wherein prior to performing the heating or light irradiation in the step of forming the first and second sealing resin layers, the viscosity of the second non-fluid resin is lower than the viscosity of the first non-fluid resin.

Advantageous Effect of Invention

In the method of manufacturing a display panel according to the above mode, generation of film exfoliation arising from flow of resin between the first panel section and the second panel section is restrained, and a display panel having high display quality can be provided.

BRIEF DESCRIPTION OF DRAWINGS

FIGS. 4A and 4B show schematic sectional views showing the configuration of an EL panel section 11 of the display panel 10, wherein FIG. 4(a) is a schematic sectional view taken along A1-A2 of FIG. 2, and FIG. 4(b) is a schematic sectional view taken along B1-B2 of FIG. 2.

FIGS. 6A and 6B show schematic sectional views showing the configuration of the CF panel section 12 of the display panel 10, wherein FIG. 6(a) is a schematic sectional view taken along C1-C2 of FIG. 4, and FIG. 6(b) is a schematic sectional view taken along E1-E2 of FIGS. 4A and 4B.

FIGS. 7(a) to 7(d) are schematic views showing a manufacturing process of the EL panel section 11, wherein FIG. 7(a) shows a step of forming an insulating film in a stacked manner, FIG. 7(b) shows a step of forming a metallic thin film, FIG. 7(c) shows a step of forming an anode and an auxiliary electrode, and FIG. 7(d) shows a step of forming a bank material layer.

FIGS. 8(a) to 8(d) are schematic views showing the manufacturing process of the EL panel section 11, wherein FIG. 8(a) shows a step of forming banks, FIG. 8(b) shows a step of forming an organic light-emitting layer, FIG. 8(c) shows a step of forming cathodes, and FIG. 8(d) shows a step of forming a sealing layer.

FIGS. 9(a) to 9(f) are schematic views showing a manufacturing process of the CF panel section 12, wherein FIG. 9(a) shows a step of forming a black matrix (BM) material layer, FIG. 9(b) shows a step of disposing a mask, FIG. 9(c) shows a step of forming a BM layer, FIG. 9(d) shows a step of forming a blue (B)-CF layer, FIG. 9(e) shows a step of forming a green (G)-CF layer, and FIG. 9(f) shows a step of forming an red (R)-CF layer.

FIGS. 10(a) to 10(e) are schematic views showing an adhering process of the EL panel section 11 and the CF panel section 12, wherein FIG. 10(a) shows a step of preparing a first non-fluid resin, FIG. 10(b) shows a step of adhering the first non-fluid resin to the CF panel section, FIG. 10(c) shows a state in which the first non-fluid resin is in close contact with a main surface of the CF panel layer, FIG. 10(d) shows a step of exposing a main surface of the first non-fluid resin, and FIG. 10(e) shows a step of adhering a second non-fluid resin.

FIGS. 11(a) to 11(c) are schematic views showing an adhering step of the EL panel section 11 and the CF panel section 12, wherein FIG. 11(a) shows a step of adhering the EL panel section, FIG. 11(b) shows a state in which the second non-fluid resin is not yet in contact with the EL panel section, and FIG. 11(c) shows a step of forming a first sealing resin layer and a second sealing resin layer.

FIG. 12 is a schematic sectional view showing the configuration of a display panel 10A according to Embodiment 2.

DESCRIPTION OF EMBODIMENTS

[Discussion on Generation of Film Exfoliation]

Figure 1:
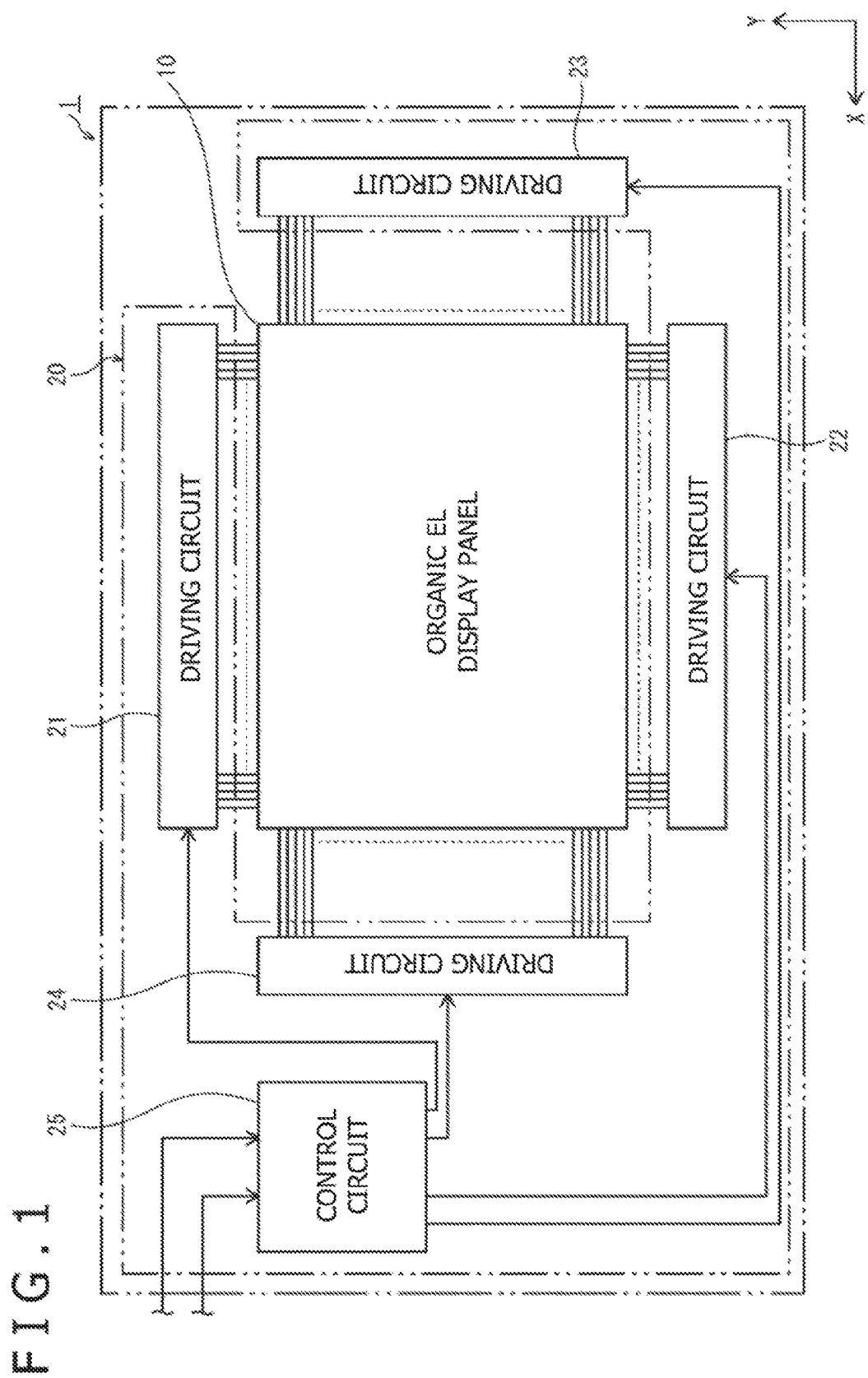
FIG. 1 is a schematic block diagram showing the general configuration of a display device 1 according to an embodiment of the present invention.

Joining together of panel sections using a non-fluid resin as above-mentioned is performed through the following steps.

(Step a) Forming a non-fluid resin on a panel section (for example, a second panel section) on one side.

(Step b) Adhering a panel section (for example, a first panel section) on another side to a remaining main surface of the non-fluid resin.

(Step c) Subjecting the non-fluid resin to heating or light irradiation to impart fluidity to the resin, and thereafter curing the resin, to thereby complete lamination (adhering together) of the panel sections.

In the above, the (Step a) and the (Step b) are carried out in a reduced-pressure atmosphere, resulting in a state in which the non-fluid resin and both the panel sections make contact with each other without any gap therebetween.

Usually, in at least one of two panel sections included in the configuration of a display panel, an opposed main surface thereof has a projected and recessed shape. Therefore, when the fluidity is imparted to the resin in the above (Step c), the density of the resin between the panel sections differs from region to region.

Specifically, the density is high in a region in which the gap between the panel sections is narrow, and the density is low in a region in which the gap is wide. This density distribution generates a pressure difference, resulting in that the resin flows from the region where the gap is narrow toward the region where the gap is wide.

Such a flow of the resin causes exertion of a shearing force on a film body present on the opposed surface side of the panel section (for example, in the case of an organic EL display panel, a sealing layer or an electrode layer or an organic EL layer of an EL panel section, or the like). In addition, it is considered that film exfoliation is generated when the shearing force increases to or above a certain extent.

The film exfoliation at the panel section leads directly to a lowering in display quality, so that it is important for enhancing the display quality of a display panel to minimize the shearing force exerted on the film body when the laminating (adhering-together) step is conducted.

MODES OF THE PRESENT INVENTION

A method of manufacturing a display panel according to one mode of the present invention includes: a step of preparing a first panel section of which a first main surface as a one-side main surface has a projected and recessed shape; a step of preparing a second panel section; a step of disposing a sheet-shaped first non-fluid resin in such a manner that a one-side main surface thereof makes contact with a second main surface as a one-side main surface of the second panel section; a step of disposing a sheet-shaped second non-fluid resin in such a manner that a one-side main surface thereof makes contact with an other-side main surface of the first non-fluid resin; a step of disposing the first panel section in such a manner that the first main surface of the first panel section makes contact with an other-side main surface of the second non-fluid resin; and a step of subjecting the first and second non-fluid resins to heating or light irradiation to impart fluidity to the resins and thereafter curing the resins to thereby form first and second sealing resin layers respectively from the first and second non-fluid resins, wherein prior to performing the heating or light irradiation in the step of forming the first and second sealing resin layers, the viscosity of the second non-fluid resin is lower than the viscosity of the first non-fluid resin.

In addition, in a specific aspect of the method of manufacturing a display panel according to one mode of the present invention, the step of disposing the first non-fluid resin and the step of disposing the first panel section are both carried out in a reduced-pressure atmosphere; and after both of the steps are carried out, the second non-fluid resin is in contact with a whole part of the first main surface of the first panel section inclusive of a top portion of a projected section and a bottom portion of a recessed section of the projected and recessed shape of the first main surface, and the first non-fluid resin is in contact with a whole part of the second main surface of the second panel section.

Besides, in a specific aspect of the method of manufacturing a display panel according to one mode of the present invention, the difference between the viscosity of the first non-fluid resin and the viscosity of the second non-fluid resin is not less than 1,000 Pa·s.

In addition, in a specific aspect of the method of manufacturing a display panel according to one mode of the present invention, the viscosity of the first non-fluid resin is not more than 35,000 Pa·s; and the viscosity of the second non-fluid resin is not less than 15,000 Pa·s.

In addition, in a specific aspect of the method of manufacturing a display panel according to one mode of the present invention, the first panel section has a substrate, and a light-emitting region and a non-light-emitting region which are located over the substrate and are adjacent to each other in plan view; and the recessed section of the projected and recessed shape of the first main surface corresponds to the light-emitting region, whereas the projected section of the projected and recessed shape of the first main surface corresponds to the non-light-emitting region.

Besides, in a specific aspect of the method of manufacturing a display panel according to one mode of the present invention, the second main surface of the second panel section is flatter than the first main surface of the first panel section.

A method of manufacturing a display panel according to one mode of the present invention includes: a step of preparing a first panel section of which a first main surface as a one-side main surface has a projected and recessed shape; a step of preparing a second panel section; a step of disposing a sheet-shaped first non-fluid resin in such a manner that a one-side main surface thereof makes contact with a second main surface as a one-side main surface of the second panel section; a step of disposing a sheet-shaped second non-fluid resin in such a manner that a one-side main surface thereof makes contact with an other-side main surface of the first non-fluid resin; a step of disposing a third non-fluid resin on an other-side main surface of the second non-fluid resin; a step of disposing the first panel section in such a manner that the first main surface thereof makes contact with a main surface of the third non-fluid resin opposed to the main surface with which the second non-fluid resin makes contact; and a step of subjecting the first, second and third non-fluid resins to heating or light irradiation to impart fluidity to the resins and thereafter curing the resins to thereby form first, second and third sealing resin layers respectively from the first, second and third non-fluid resins, wherein prior to performing the heating or light irradiation in the step of forming the first, second and third sealing resin layers, the viscosity of the third non-fluid resin is lower than at least one of the viscosities of the first non-fluid resin and the second non-fluid resin.

In addition, in a specific aspect of the method of manufacturing a display panel according to one mode of the present invention, the difference between the viscosity of the third non-fluid resin and the viscosity of the first non-fluid resin is not less than 1,000 Pa·s.

Besides, in a specific aspect of the method of manufacturing a display panel according to one mode of the present invention, the viscosity of the third non-fluid resin is not less than 35,000 Pa·s.

In addition, in a specific aspect of the method of manufacturing a display panel according to one mode of the present invention, a substrate, and a light-emitting region and a non-light-emitting region which are located over the substrate and are adjacent to each other in plan view, are provided; and the recessed section of the projected and recessed shape of the first main surface corresponds to the light-emitting region, whereas the projected section of the projected and recessed shape of the first main surface corresponds to the non-light-emitting region.

A display panel according to one mode of the present invention includes: a first panel section of which a first main surface as a one-side main surface has a projected and recessed shape; a second panel section disposed to face the first main surface of the first panel section with a spacing therebetween; a sheet-shaped second sealing resin layer which is disposed between the first panel section and the second panel section and of which a one-side main surface is in contact with the first main surface of the first panel section; and a sheet-shaped first sealing resin layer which is disposed between the second panel section and the second sealing resin layer and of which a one-side main surface is in contact with the second sealing resin layer, wherein the first sealing resin layer and the second sealing resin layer are formed through a state in which the viscosity of the second sealing resin layer is lower than the viscosity of the first sealing resin layer in a form of being disposed between the first panel section and the second panel section.

In addition, in a specific aspect of the display panel according to one mode of the present invention, a second main surface as a one-side main surface of the second panel section has a projected and recessed shape in which a top portion of a projected section protrudes toward the first panel section side more than a bottom portion of a recessed section; the display panel further includes a third sealing resin layer which is disposed between the second sealing resin layer and the first panel section, a one-side main surface of which is in contact with the second main surface of the first sealing resin layer, and an other-side main surface of which is in contact with the second main surface of the second panel section; and the first sealing resin layer, the second sealing resin layer and the third sealing resin layer are formed through a state in which the viscosity of the third sealing resin layer is lower than the viscosity of the second sealing resin layer in a form of being disposed between the first panel section and the second panel section.

Besides, in a specific aspect of the method of manufacturing a display panel according to one mode of the present invention, a substrate, and a light-emitting region and a non-light-emitting region which are located over the substrate and are adjacent to each other in plan view, are provided; and the recessed section of the projected and recessed shape of the first main surface corresponds to the light-emitting region, whereas the projected section of the projected and recessed shape of the first main surface corresponds to the non-light-emitting region.

In addition, in a specific aspect of the display panel according to one mode of the present invention, when that region of the second panel section which corresponds to the non-light-emitting region of the first panel section in a case of viewing the first panel section and the second panel section in plan view is defined as a non-light-emission corresponding region, the recessed section of the second main surface of the second panel section is provided in the non-light-emission corresponding region.

Besides, in a specific aspect of the display panel according to one mode of the present invention, when that region of the second panel section which corresponds to the non-light-emitting region of the first panel section in a case of viewing the first panel section and the second panel section in plan view is defined as a non-light-emission corresponding region, the projected section of the second main surface of the second panel section is provided in the non-light-emission corresponding region.

In addition, in a specific aspect of the display panel according to one mode of the present invention, the second panel section is a color filter panel which includes a substrate, a color filter layer formed over the substrate, and a black matrix layer formed adjacent to the color filter layer.

Embodiment 1

1. General Configuration of Display Device

A general configuration of a display device 1 according to an embodiment of the present invention will be described referring to FIGS. 1 and 2.

As shown in FIG. 1, the display device 1 includes an organic EL display panel (hereinafter described simply as "display panel") 10, and a driving control section 20 connected thereto. The display panel 10 is a panel utilizing an electroluminescence phenomenon of organic material, and has a plurality of pixel portions.

Figure 2:
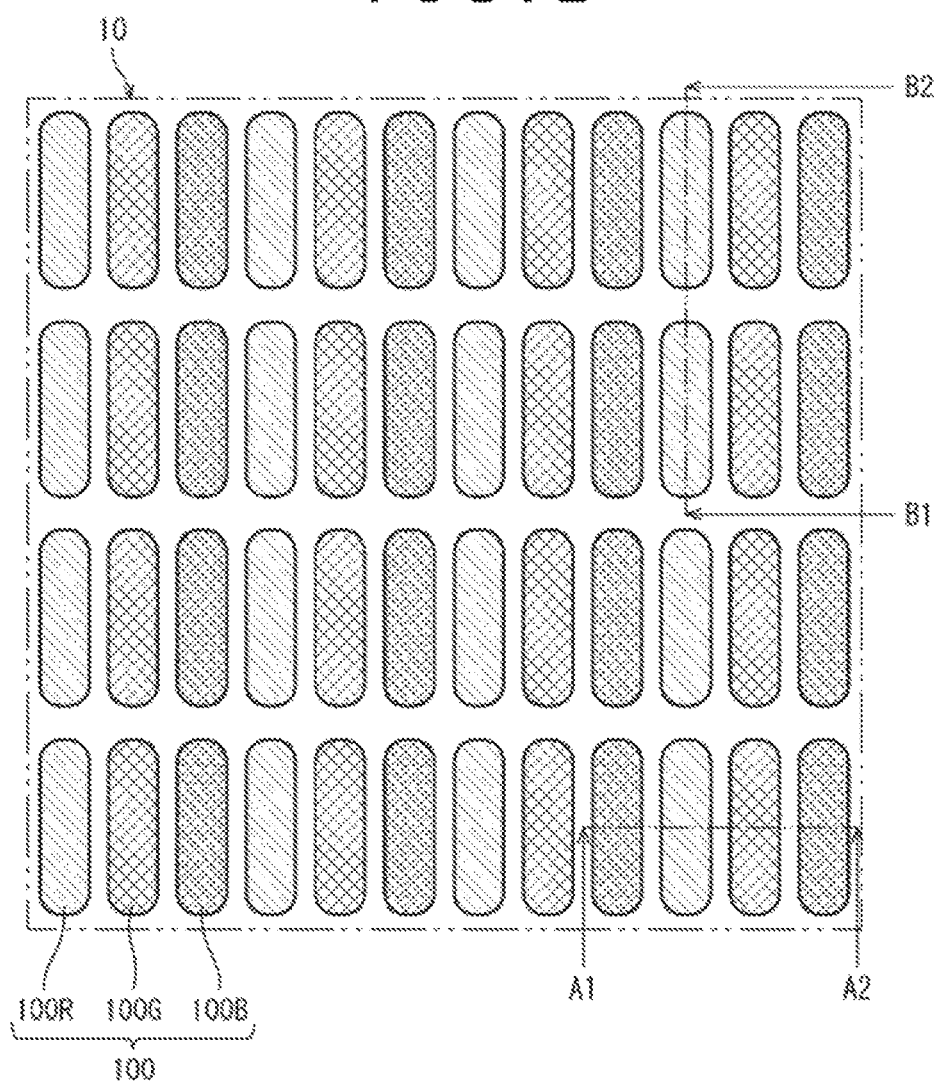
FIG. 2 is a schematic plan view showing a pixel configuration in a display panel 10 of the display device 1.

As illustrated in FIG. 2, in the display panel 10, there are provided pluralities of sub-pixels 100R, 100G, and 100B arranged two-dimensionally in X-Y directions. The sub-pixels 100R, 100G, and 100B arranged adjacently to one another constitute one pixel 100.

Returning to FIG. 1, the driving control section 20 is composed of four driving circuits 21 to 24 and a control circuit 25.

Note that the layout relation between the display panel 10 and the driving control section 20 in the display device 1 is not limited to the form shown in FIG. 1. In addition, the circuits possessed by the driving control section 20 are not limited to the form depicted in FIG. 1.

Besides, the pixel configuration is not limited to the form composed of sub-pixels for three colors of R, G, and B as illustrated in FIG. 2, and one pixel may be composed of four or more colors.

2. Configuration of Display Panel

The configuration of the display panel 10 will be described referring to FIGS. 3 to 6. Note that here, an EL panel section is used as a first panel section, and a CF panel section is used as a second panel section.

Figure 3:
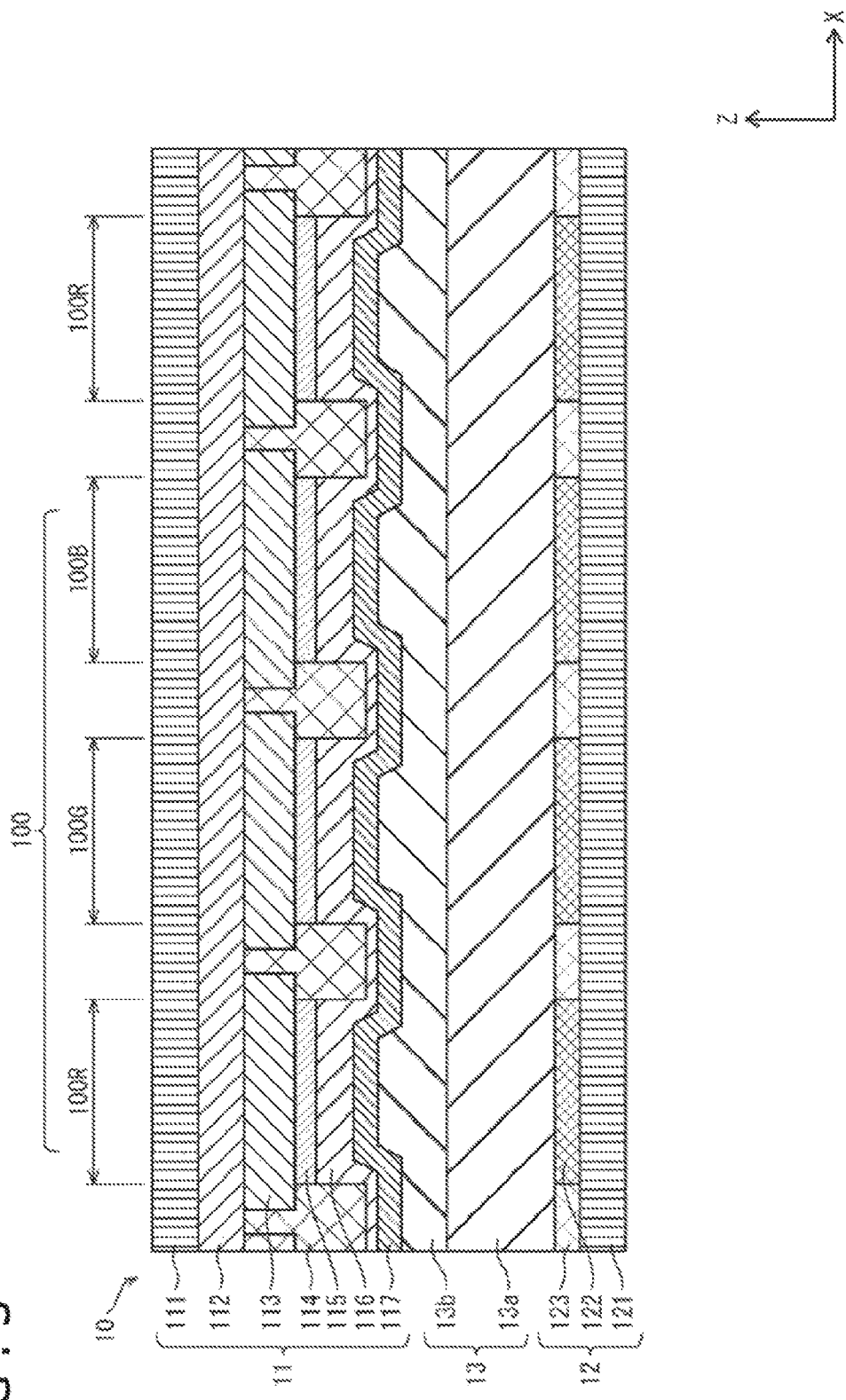
FIG. 3 is a schematic sectional view showing the configuration of the display panel 10.

First, as shown in FIG. 3, an EL panel section 11 in which a plurality of film bodies 111 to 117 are formed in a stacked manner over a substrate 111 and a CF panel section 12 in which layers 122 and 123 are formed in a stacked manner over a substrate 121 are disposed to face each other, with a sealing resin layer 13 sandwiched therebetween.

The sealing resin layer 13 is in contact with both a Z-axis-directionally lower-side main surface (first main surface) of the EL panel section 11 and a Z-axis-directionally upper-side main surface (second main surface) of the CF panel section 12.

The sealing resin layer 13 plays not only the role of joining the EL panel section 11 and the CF panel section 12 to each other but also the role of inhibiting penetration of moisture, air or the like into the EL panel section 11 from outside.

(1) Configuration of EL Panel Section 11

As depicted in FIGS. 4(a) and 4(b), the EL panel section 11 has an interlayer insulating film 112 stacked on a one-side main surface (a main surface on the Z-axis-directionally lower side) of the substrate 111. The substrate 111 has a TFT layer (omitted in the drawing). The interlayer insulating film 112 plays the role of electrical insulation and also the role as a flattening film for restraining the influence of ruggedness (projected and recessed contour) of the surface of the substrate 111 due to the TFT layer.

On the interlayer insulating film 112, anodes 113 are formed on the basis of each of the sub-pixels 100R, 100G, and 100B. As shown in FIGS. 4(a) and 4(b), the anodes 113 have a shape in which the length thereof in a Y-axis direction is greater than the length thereof in an X-axis direction.

Between the adjacent anodes 113, a bank 114 is erectly provided. The banks 114 are provided in such a manner as to overlap with part of the anode 113 and to surround the periphery of the anode 113, and define a recessed section of a portion to be each of the sub-pixels 100R, 110G, and 100B. Note that in FIGS. 4(a) and 4(b) and the like, the banks 114 are illustrated to have a sectional shape in which side surfaces thereof rise vertically, but this is for convenience of illustration, and, actually, the side surfaces may be slant surfaces. In other words, the banks 114 may have a trapezoidal sectional shape.

In the recessed sections defined by the banks 114, an organic light-emitting layers 115 are formed in a stacked manner on the anodes 113. In this embodiment, the organic light-emitting layers 115 are layers which emit light in corresponding wavelength regions on the basis of each of the sub-pixels 100R, 100G, and 100B.

Note that while a configuration in which the anode 113 and the organic light-emitting layer 115 are in contact with each other is adopted as an example in this embodiment, there may also be adopted a configuration in which a hole injection layer, a hole transport layer or the like is interposed between these layers.

A cathode 116 and a sealing layer 117 are sequentially formed in a stacked manner over the organic light-emitting layers 115. The cathode 116 and the sealing layer 117 are formed in a continuous state over the whole part of the EL panel section 11, and are formed also on top portions of the banks 114. Therefore, the surface of the sealing layer 117, or the Z-axis-directionally lower-side surface of the EL panel section 11, has a projected and recessed shape as a whole, wherein those portions corresponding to the top portions of the banks 114 are projected sections 117a projected downward in the Z-axis direction, and those portions corresponding to portions between the banks 114 are recessed sections 117b recessed upward in the Z-axis direction. In other words, a projection-recess gap Ge1 is present in the Z-axis-directionally lower-side main surface of the EL panel section 11.

Note that while a configuration in which the organic light-emitting layer 115 and the cathode 116 are in contact with each other is adopted as an example in this embodiment, there may also be adopted a configuration in which an electron injection layer, an electron transport layer or the like is interposed between these layers.

By the configuration as above, the EL panel section 11 has the substrate 111, and light-emitting regions and non-light-emitting regions which are located over the substrate 111 and are adjacent to each other in plan view, the light-emitting regions being disposed to be recessed relative to the non-light-emitting regions. In addition, the projected and recessed shape composed of the light-emitting regions and the non-light-emitting regions is reflected on the shape of a first main surface which is a one-side main surface of the EL panel section 11.

(2) Configuration of CF Panel Section 12

Figure 5:
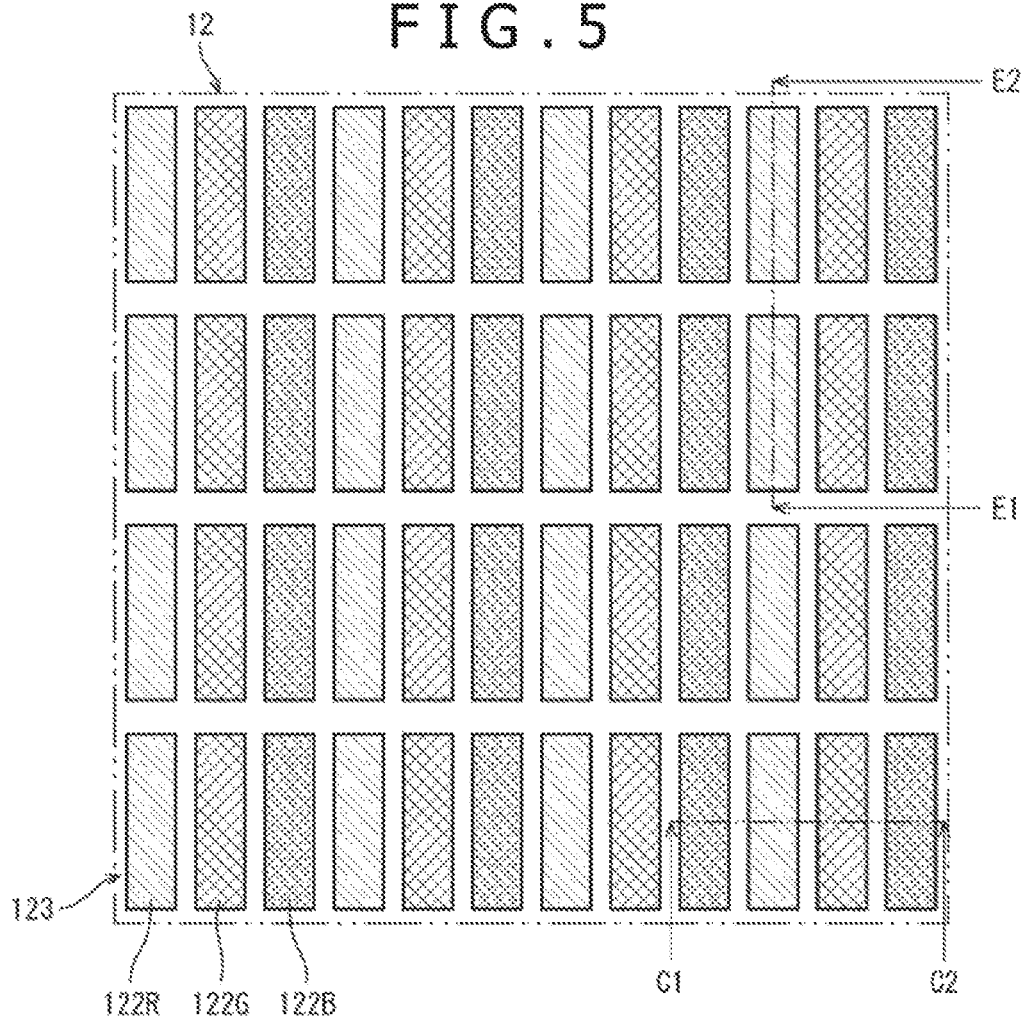
FIG. 5 is a schematic plan view showing the configuration of a CF panel section 12 of the display panel 10.

As shown in FIG. 5, in plan view in X-Y directions, the CF panel section 12 has a configuration in which color filter layers (R-CF layers) 122R for red color, color filter layers (G-CF layers) 122G for green color, and color filter layers (B-CF layers) 122B for blue color are arranged two-dimensionally in the X-Y directions. The layout of the color filter layers 122R, 122G, and 122B corresponds to that of the sub-pixels 100R, 100G, and 100B (see FIG. 2). In addition, the plan-view shape of each of the color filter layers 122R, 122G, and 122B is also a rectangular shape longer in the Y-axis direction than in the X-axis direction, correspondingly to the sub-pixels 100R, 100G, and 100B.

Figure 6A:
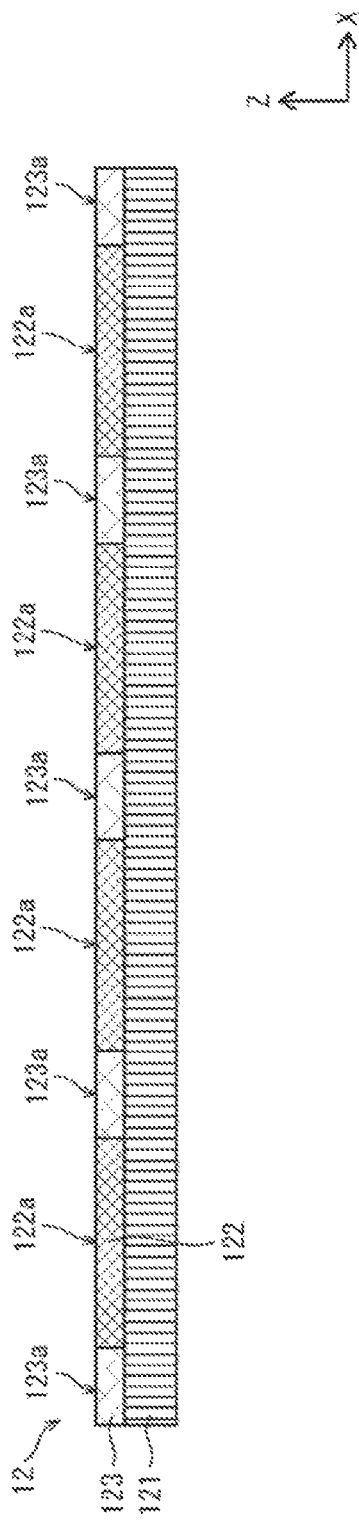
Figure 6B:
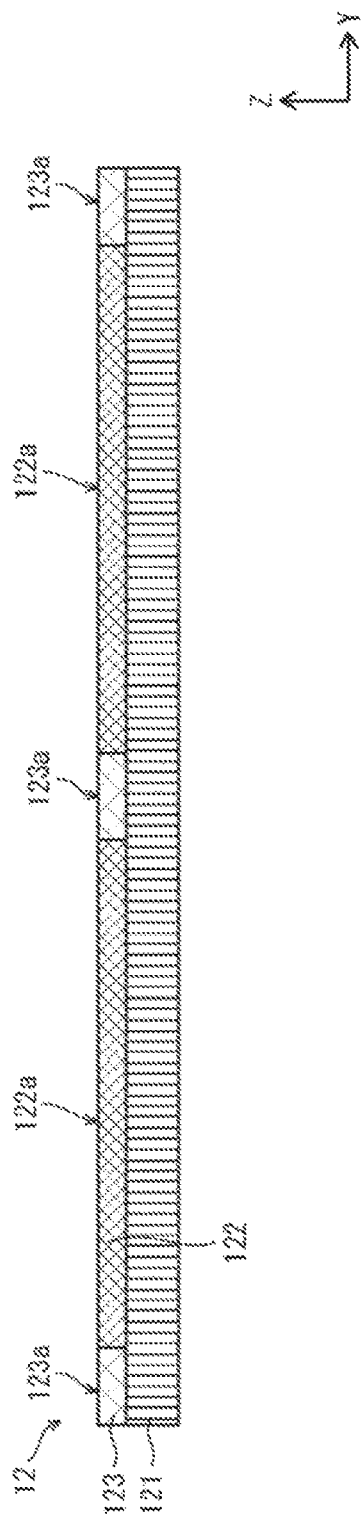

As illustrated in FIGS. 6(a) and 6(b), a black matrix layer (hereinafter sometimes described as "BM layer") 123 is formed between the adjacent color filter layers (hereinafter sometimes described as "CF layers") 122. A peripheral portion of the CF layer 112 is in a state of getting on the BM layer 123.

The BM layer 123 is a black layer provided for the purposes of restraining back-glaring of light emission onto a display surface of the display panel 10 or incidence of external light on the display surface and contriving an enhanced display contrast. As shown in FIG. 3, the BM layer 123 of the CF panel section 12 is formed in the state of corresponding to (facing) the banks 114 of the EL panel section 11.

As shown in FIGS. 6(a) and 6(b), in the CF panel section 12, the height (thickness) up to an upper surface 123a of the BM layer 123 in the case where the surface of the substrate 121 is taken as a reference is the same as the height (thickness) up to an upper surface 122a of the CF layer 112. In other words, the Z-axis-directionally upper-side main surface of the CF panel section 12 is flatter than the Z-axis-directionally lower-side main surface of the EL panel section 11.

3. Each of Constituent Materials of Display Panel 10

(1) Substrates 111 and 121

Examples of constituent materials usable for the substrates 111 and 121 include glass substrates, quartz substrate, silicon substrate, metallic substrates of molybdenum sulfide, copper, zinc, aluminum, stainless steel, magnesium, iron, nickel, gold, silver or the like, semiconductor substrates such as gallium-arsenic group, and plastic substrates.

As the plastic substrates, both thermoplastic resins and thermosetting resins may be used. Examples of the usable resins include polyolefins such as polyethylene, polypropylene, ethylene-propylene copolymer, ethylene-vinyl acetate copolymer (EVA), etc., cyclic polyolefins, modified polyolefins, polyvinyl chloride, polyvinylidene chloride, polystyrene, polyamides, polyimides (PI), polyimide-imides, polycarbonates, poly-(4-methylbentene-1), ionomers, acrylic resins, polymethyl methacrylate, acryl-styrene copolymer (AS resin), butadiene-styrene copolymer, polyocopolymer (EVOH), polyethylene terephthalate (PET), polybutylene terephthalate, polyethylene naphthalate (PEN), pulycyclohexane terephthalate (PCT) and the like polyesters, polyethers, polyether ketones, polyether sulfones (PES), polyether imides, polyacetal, polyphenylene oxide, deformed polyphenylene oxide, polyarylates, aromatic polyesters (liquid crystal polymers), polytetrafluoroethylene, polyvinylidene fluoride, and other fluororesins, various thermoplastic elastomers based on styrene, polyolefin, polyvinyl chloride, polyurethane, fluoro-rubber, polyethylene chloride or the like, epoxy resins, phenolic resins, urea resins, melamine resins, unsaturated polyesters, silicone resins, polyurethane, and copolymers, blends, polymer alloys and the like containing these as main component, which may be used either singly or as a laminate obtained by laminating two or more of them.

Note that in this embodiment, the substrate 111 of the EL panel section 11 is formed with a known TFT layer. This is omitted in the drawings, and description thereof is also omitted because a known configuration is appropriately used.

(2) Interlayer Insulating Film 112

The interlayer insulating film 112 is formed by use of an organic compound such as, for example, polyimide, polyamide, and acrylic resins. Here, it is preferable for the interlayer insulating film 112 to be resistant to organic solvents. In addition, since the interlayer insulating film 112 may be subjected to an etching treatment, a baking treatment or the like during the manufacturing step, it is desirable that the interlayer insulating film 112 be formed by use of a material having high durability such as not to be deformed or denatured excessively when subjected to the treatment.

(3) Anode 113

The anode 113 is composed of a metallic material containing silver (Ag) or aluminum (Al). In the case of the display panel 10 in this embodiment of the top emission type, a surface portion of the anode 113 preferably has high reflectance.

Note that for the anode 113, not only a monolayer structure composed of the above-mentioned metallic material but also a laminate of a metallic layer and a transparent conductive layer can be adopted. As a constituent material for the transparent conductive layer, for example, indium tin oxide (ITO), indium zinc oxide (IZO) and the like can be used.

(4) Bank 114

The bank 114 is formed by use of an organic material such as resin, and has an insulating property. Examples of the organic material to be used for forming the bank 114 include acrylic resins, polyimide resins, and novolac type phenolic resins. The bank 114 may have its surface subjected to a fluorine treatment, for rendering the surface water-repellent.

Furthermore, as for the structure of the bank 114, not only a one-layer structure as depicted in FIG. 3 and FIGS. 4(a) and 4(b) but also a multilayer structure composed of two or more layers can be adopted. In such a case, the above-mentioned materials may be combined with one another on a layer basis. An inorganic material and an organic material may be used on a layer basis.

(5) Organic Light-emitting Layer 115

The organic light-emitting layer 115 has a function of emitting light based on generation of an excited state due to injection of holes and electrons and recombination of them, as aforementioned. As a material for forming the organic light-emitting layer 115, it is necessary to use a light-emitting organic material capable of being formed into a film by a wet printing method.

Specifically, the organic light-emitting layer 115 is preferably formed from a fluorescent material such as oxinoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds and azaquinolone compounds, pyrazoline derivatives and pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, anthracene compounds, cyanine compounds, acridine compounds, 8-hydroxyquinoline compounds metal complexes, 2-bipyridine compounds metal complexes, complexes of Schiff base and Group III metal, oxine metal complexes, rare earth complexes, which are described in patent publication (Japanese Patent Laid-open No. 1993-163488).

(6) Cathode 116

The cathode 116 is formed by use of, for example, indium tin oxide (ITO) or indium zinc oxide (IZO) or the like. In the case of the display panel 10 according to this embodiment of the top emission type, as in this embodiment, it is necessary for the cathode 116 to be formed from a light-transmitting material. As for the light-transmitting property, a transmittance of not less than 80 is preferred.

(7) Sealing Layer 117

The sealing layer 117 has a function of inhibiting the organic layers such as the organic light-emitting layer 115 from being exposed to moisture or exposed to air, and is formed by use of, for example, such a material as silicon nitride (SiN) or silicon oxynitride (SiON). In addition, a sealing resin layer formed of a resin material such as acrylic resin or silicone resin may be provided on the layer formed by use of such a material as silicon nitride (SiN) or silicon oxynitride (SiON).

In the case of the display panel 10 according to this embodiment of the top emission type, it is necessary for the sealing layer 117 to be formed from a light-transmitting material.

(8) CF Layer 122

The CF layer 122 of the CF panel section 12 is composed of a known material which selectively transmits visible light in a wavelength region of each color of R, G, and B. For example, the CF layer 122 is formed by using an acrylic resin as a base material.

(9) BM Layer 123

The BM layer 123 of the CF panel section 12 is composed of, for example, an ultraviolet (UV)-curing resin material containing a black pigment which is excellent in light-absorbing property and light-blocking property. Specific examples of the UV-curing resin material include acrylic resins.

(10) Sealing Resin Layer 13

The sealing resin layer 13 is composed of one of various transparent resin materials. Specifically, the sealing resin layer 13 is composed of, for example, an epoxy resin, a silicone resin or the like.

(11) Others

Though omitted in this embodiment, a hole injection layer and a hole transport layer may be interposed between the anode 113 and the organic light-emitting layer 115, and, in that case, for example, the following materials can be used.

(i) Hole Injection Layer

The hole injection layer is a layer composed of, for example, an oxide of silver (Ag), molybdenum (Mo), chromium (Cr), vanadium (V), tungsten (W), nickel (Ni), iridium (Ir) or the like, or a conductive polymer material such as PEDOT (a mixture of polythiophene and polystyrene sulfonic acid). Note that in the case where a metallic oxide is used as the constituent material of the hole injection layer, a function of injecting holes into the organic light-emitting layer 108 more stably or while assisting generation of holes is obtained and a higher work function is obtained, as compared to the case where a conductive polymer material such as PEDOT is used.

Here, in the case where the hole injection layer is composed of an oxide of a transition metal, the oxide takes a plurality of oxidation numbers and can thereby take a plurality of levels, resulting in that hole injection becomes easy and the driving voltage can be reduced. Particularly, tungsten oxide (WOX) can be used, and it is desirable from the viewpoint of having a function of stably injecting holes and assisting generation of holes.

(ii) Hole Transport Layer

The hole transport layer is formed by use of a high-molecular compound that does not have a hydrophilic group. Examples of the high-molecular compound usable here include those high-molecular compounds such as polyfluorenes, derivatives thereof, polyallylamines and derivatives thereof which do not have a hydrophilic group.

In addition, in the case where an electron transport layer is interposed between the organic light-emitting layer 115 and the cathode 116, the following materials, for example, can be used as the material of the electron transport layer.

(iii) Electron Transport Layer

The electron transport layer has a function of transporting to the organic light-emitting layer 115 the electrons injected from the cathode 116, and is formed by use of, for example, an oxadiazole derivative (OXD), a triazole derivative (TAZ), or a phenanthroline derivative (BCP, Bphen).

4. Detailed Configuration of Sealing Resin Layer 13

As shown in FIG. 3, the sealing resin layer 13 according to this embodiment has a two-layer structure of a first sealing resin layer 13a and a second sealing resin layer 13b. The first sealing resin layer 13a is disposed between the EL panel section 11 and the CF panel section 12, and does not make contact with a Z-axis-directionally lower-side main surface of the EL panel section 11, but makes contact with a Z-axis-directionally upper-side main surface of the CF panel section 12 that faces the Z-axis-directionally lower-side main surface of the EL panel section 11. The second sealing resin layer 13b is disposed between the EL panel section 11 and the first sealing resin layer 13a, and makes contact with at least the first sealing resin layer 13a. In this embodiment, the second sealing resin layer 13b is in contact with both the first sealing resin layer 13a and the Z-axis-directionally lower-side main surface of the EL panel section 11.

Besides, in this embodiment, the viscosity of a non-fluid resin used as the raw material of the second sealing resin layer 13b is lower than the viscosity of a non-fluid resin used as the raw material of the first sealing resin layer 13a. Note that the non-fluid resin used as the raw material of the first sealing resin layer 13a is a first non-fluid resin 130 to be described later (see FIGS. 10A, 10B, 10C, 10D, and 10E), while the non-fluid resin used as the raw material of the second sealing resin layer 13b is a second non-fluid resin 132 to be described later (see FIGS. 10A, 10B, 10C, 10D, and 10E).

5. Effect

By setting the viscosity of the non-fluid resin as the raw material of the second sealing resin layer 13b to be lower than the viscosity of the non-fluid resin as the raw material of the first sealing resin layer 13a, generation of film exfoliation is restrained. By this, high display quality can be obtained in the display panel 10 according to this embodiment.

This is considered to be because of the following mechanism.

In the display panel 10 according to this embodiment, the viscosity of the non-fluid resin as the raw material of the second sealing resin layer 13b making contact with the main surface of the EL panel section 11 that is greater in ruggedness (projected and recessed shape) of the main surface, of the EL panel section 11 and the CF panel section 12, is set lower than the viscosity of the non-fluid resin as the raw material of the first sealing resin layer 13a. Here, when the resin materials are subjected to application of heat or light energy, in the process concerning the formation of the sealing resin layer 13, resin flow is generated. Where the viscosities of the non-fluid resins as the raw materials are set in the above-mentioned relation, a shearing force exerted on each layer of the EL panel section 11 due to the resin flow can thereby be reduced as compared to the case where the sealing resin layer 13 is composed of only the non-fluid resin having a high viscosity. This is considered to be the reason why the film exfoliation is restrained.

Note that the difference between the viscosity of the non-fluid resin as the raw material of the first sealing resin layer 13a and the viscosity of the non-fluid resin as the raw material of the second sealing resin layer 13b is not particularly limited. If the viscosity of the non-fluid resin as the raw material of the second sealing resin layer 13b is lower than that of the first sealing resin layer 13a, film exfoliation is restrained, as compared to the case where the viscosity of the non-fluid resin as the raw material of the second sealing resin layer 13b is the same as that of the first sealing resin layer 13a. However, the preventing effect on generation of film exfoliation is higher as the difference between the viscosity of the non-fluid resin as the raw material of the first sealing resin layer 13a and the viscosity of the non-fluid resin as the raw material of the second sealing resin layer 13b is greater. The difference between the viscosity of the non-fluid resin as the raw material of the first sealing resin layer 13a and the viscosity of the non-fluid resin as the raw material of the second sealing resin layer 13b is desirably, for example, not less than 1,000 [Pa·s]. In addition, the viscosity of the non-fluid resin as the raw material of the first sealing resin layer 13a is desirably not more than 35,000 [Pa·s], and the viscosity of the non-fluid resin as the raw material of the second sealing resin layer 13b is desirably not less than 15,000 [Pa·s].

Besides, although an upper limit for the thickness of the first sealing resin layer 13a and the thickness of the second sealing resin layer 13b are not particularly limited, it is desirable that a lower limit of the thickness of the second sealing resin layer 13b be such a thickness that the ruggedness (projected and recessed shape) of the Z-axis-directionally lower-side main surface of the EL panel section 11 can be buried. Specifically, this is preferably a thickness of not less than the projection-recess gap Ge1 shown in FIGS. 4A and 4B.

6. Manufacturing Method

The method of manufacturing the display panel 10 according to this embodiment will be described referring to FIGS. 7A-D to FIGS. 11A-C. Note that the manufacturing method for the display panel 10 according to this embodiment will be described by generally dividing the manufacturing process into (1) a step of preparing the EL panel section 11, (2) a step of preparing the CF panel section 12, and (3) a step of adhering the EL panel section 11 and the CF panel section 12 to each other.

(1) Step of Preparing EL Panel Section 11

(i) As shown in FIG. 7(a), the interlayer insulating film 112 is formed in a stacked manner on the substrate 111 formed with the TFT layer. Then, as depicted in FIG. 7(b), a metallic thin film 1130 is formed on the interlayer insulating film 112. The formation of the metallic thin film 1130 can be carried out by a sputtering method, for example.

Next, the metallic thin film 1130 on the interlayer insulating film 112 is patterned, to form the anodes 113 and an auxiliary electrode (bus bar) 118. The patterning can be carried out, for example, by a photolithographic method.

Figure 8A:
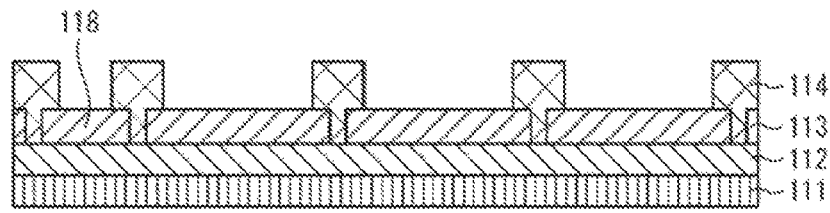

Subsequently, as illustrated in FIG. 7(d), a bank material layer 1140 composed of an insulating organic material is formed in such a manner as to cover the anodes 113 and the auxiliary electrode 118. Then, as shown in FIG. 8(a), the bank material layer 1140 is patterned, whereby the banks 114 are erectly formed between the adjacent anodes 113 and between the anode 113 and the auxiliary electrode 118 which are adjacent to each other. The patterning of formation of the banks 114 is performed by, for example, a method in which a mask provided with predetermined openings therein is disposed on the upper side, exposure is conducted, and thereafter development is conducted to remove unnecessary portions (a wet process is conducted).

Figure 8B:
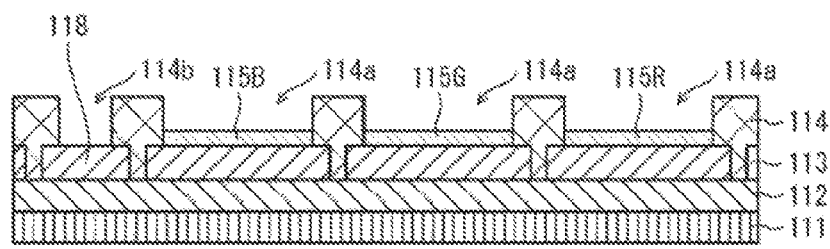

(ii) As depicted in FIG. 8(b), recessed sections 114a defined by the banks 114 are formed with organic light-emitting layers 115R, 115G, and 115B differing in light emission color on a recessed section basis. A recessed section 114b on the upper side of the auxiliary electrode 118 is not formed with the organic light-emitting layer.

The formation of the organic light-emitting layers 115R, 115G, and 115B can be carried out, for example, by an ink jet method. Specifically, the formation can be performed by applying inks that contain organic light-emitting materials on the basis of the recessed sections 114a, and thereafter drying the inks.

Figure 8C:
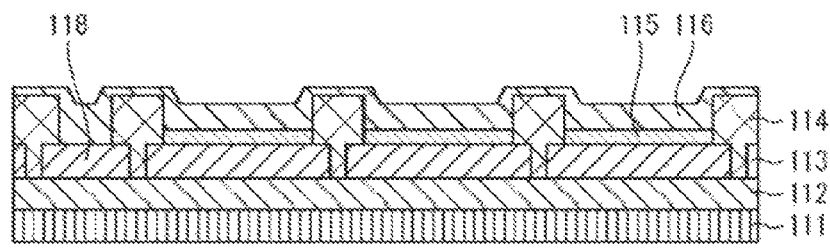

(iii) As shown in FIG. 8(c), the cathode 116 is formed in a continuous form on the organic light-emitting layer 115 (generic term of the organic light-emitting layers 115R, 115G, 115B) and in such a manner as to cover the exposed portions of the banks 114. The formation of the cathode 116 can be performed, for example, by a sputtering method or the like.

Figure 8D:
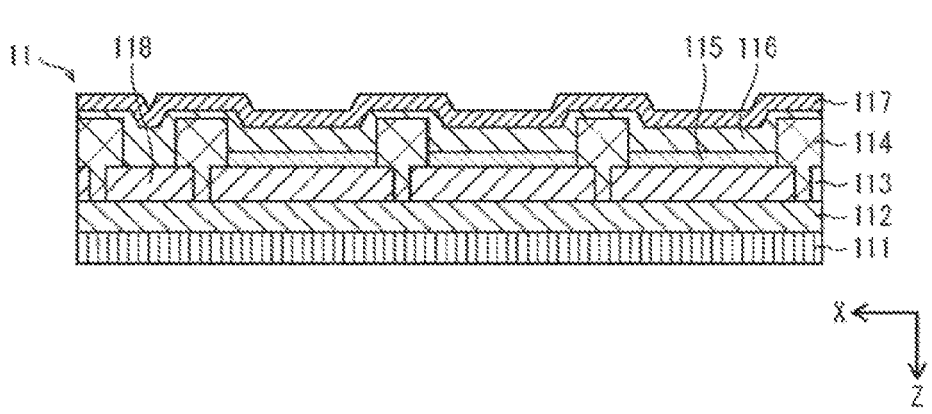

(iv) As illustrated in FIG. 8(d), the sealing layer 117 is formed such as to cover the cathode 116. The formation of the sealing layer 117 can be carried out by, for example, a sputtering method, a chemical vapor deposition (CVD) method, an atomic layer deposition (ALD) method or the like.

(2) Step of Preparing CF Panel Section 12

Figure 9A:

(i) As shown in FIG. 9(a), a BM material layer 1230 is formed in a stacked manner on a one-side main surface of the substrate 121. In forming the BM material layer 1230, first, a BM material including a UV-curing resin (e.g., UV-curing acrylic resin) material as a main constituent with a black pigment added thereto is dispersed in a solution, to prepare a BM paste. Then, the paste thus prepared is applied in such a manner as to cover the one-side main surface of the substrate 121.

Next, the paste thus applied is dried and the solvent is volatilized to a certain extent, to form the BM material layer 1230.

Figure 9B:
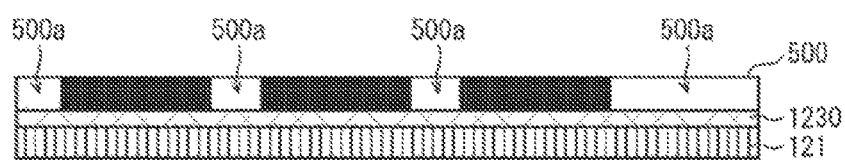

(ii) As depicted in FIG. 9(b), a mask 500 is disposed on the BM material layer 1230 which has been dried such that its form can be maintained. In the mask 500, window portions 500a are opened correspondingly to formation positions at the banks 114 of the EL panel section 11.

Next, an exposed surface of the BM material layer 1230 is irradiated with UV light through the window portions 500a of the mask 500.

Figure 9C:
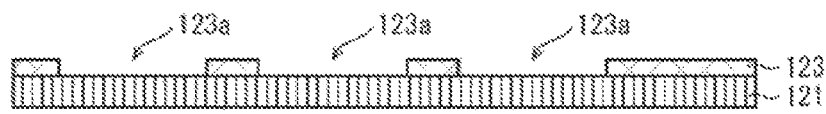

(iii) After the irradiation with UV light, the BM material layer 1230 after dried is developed, to remove unexposed portions, after which baking is conducted, whereby the BM layer 123 as shown in FIG. 9(c) can be formed. Note that the BM layer 123 thus formed is disposed at positions corresponding to the banks 114 of the EL panel section 11.

Figure 9D:
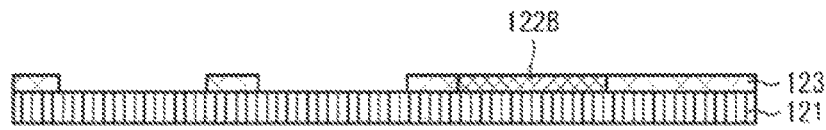

(iv) As illustrated in FIG. 9(d), opening portions 123a defined by the BM layer 123 are formed with a CF layer 122B for blue color. In forming the CF layer 122B, first, a CF material including a UV-curing resin component as a main constituent is dispersed in a solvent to make a paste, then the paste is formed, and the solvent is volatilized to a certain extent. Thereafter, a mask provided therein with predetermined window portions is disposed (omitted in the drawing), and irradiation with UV light is conducted through the window portions.

Thereafter, development is performed, to remove the mask and the uncured paste, followed by baking. By this, a B-CF layer 122B as depicted in FIG. 9(d) is formed. Note that as aforementioned, in this embodiment, all the CF layers 122 are formed in a state where peripheral portions thereof get on the BM layer 123.

Figure 9E:
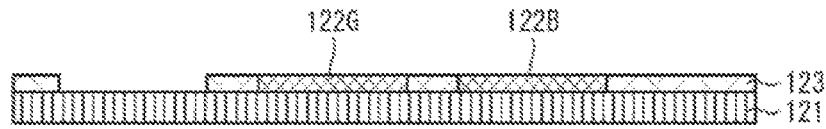

(v) As illustrated in FIG. 9(e), the same operation as above is repeated to form a G-CF layer 122G.

Figure 9F:
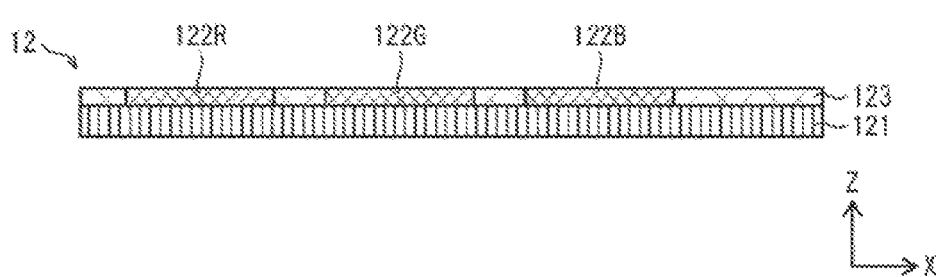

(vi) As shown in FIG. 9(f), the same operation as above is repeated to form an R-CF layer 122R.

Note that the order in which the R-CF layer 122R, G-CF layer 122G, and B-CF layer 122B are formed may be different from the above-mentioned.

Figure 10A:
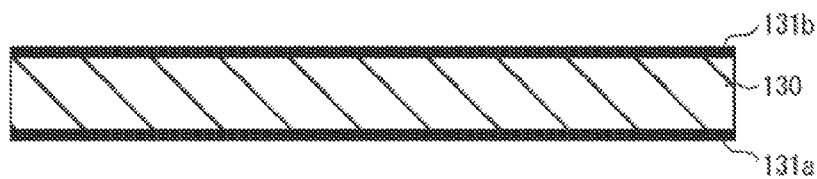

(3) Step of Adhering EL Panel Section 11 and CF Panel Section 12 to Each Other (i) As illustrated in FIG. 10(a), the sheet-shaped first non-fluid resin (material) 130 is prepared. Laminate films 131a and 131b are adhered to both main surfaces of the first non-fluid resin 130.

Figure 10B:
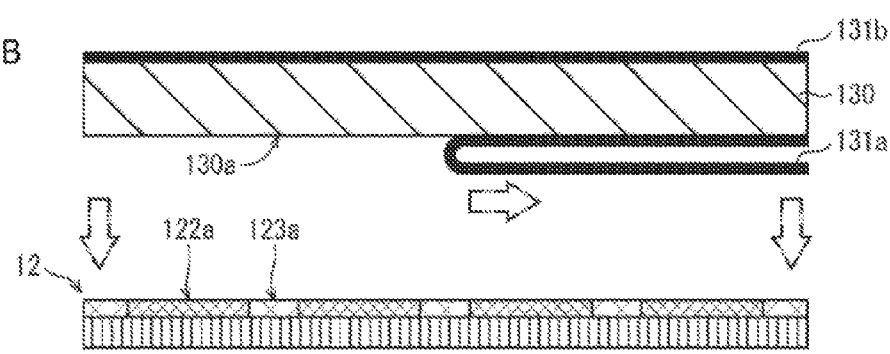

(ii) As depicted in FIG. 10(b), the one-side laminate film 131a adhered to the first non-fluid resin 130 is peeled, and a main surface 130a thus exposed is adhered to the CF panel section 12. Note that in this embodiment, the adhesion of the first non-fluid resin 130 and the CF panel section 12 to each other is carried out in a reduced-pressure atmosphere.

Figure 10C:
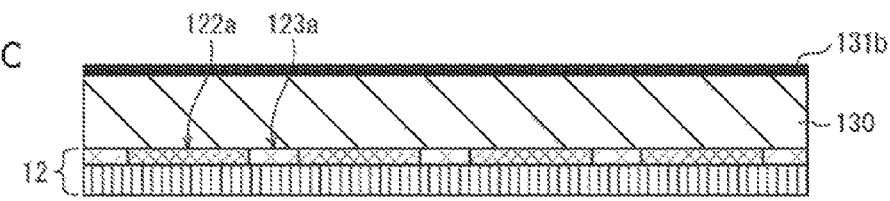

(iii) As shown in FIG. 10(c), after the adhesion, the main surface 130a of the first non-fluid resin 130 is in close contact with the whole main surface including the upper surface 123a of the BM layer 123 and the upper surfaces 122a of the CF layers 122 of the CF panel section 12.

Figure 10D:
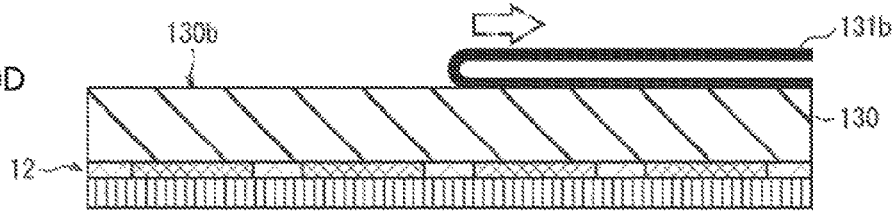

(iv) As illustrated in FIG. 10(d), the other-side laminate film 131b adhered to the first non-fluid resin 130 is peeled, to expose a main surface 130b.

Figure 10E:
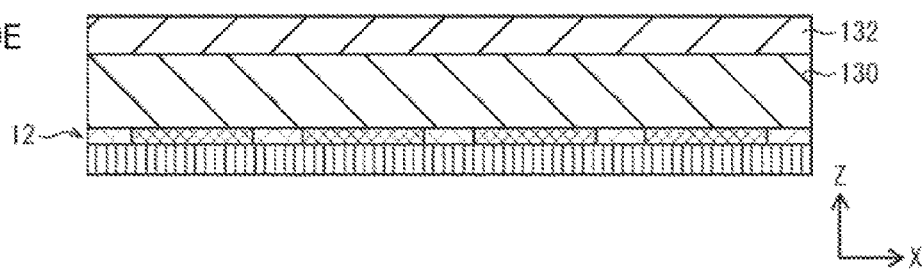

(v) As depicted in FIG. 10(e), the sheet-shaped second non-fluid resin 132 is adhered to the main surface 130b exposed by the peeling of the laminate film 131b.

Figure 11A:
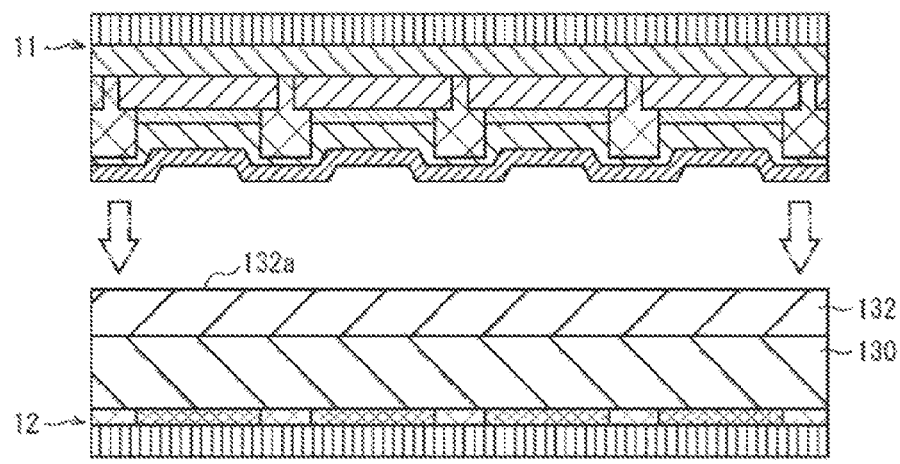
Figure 11B:
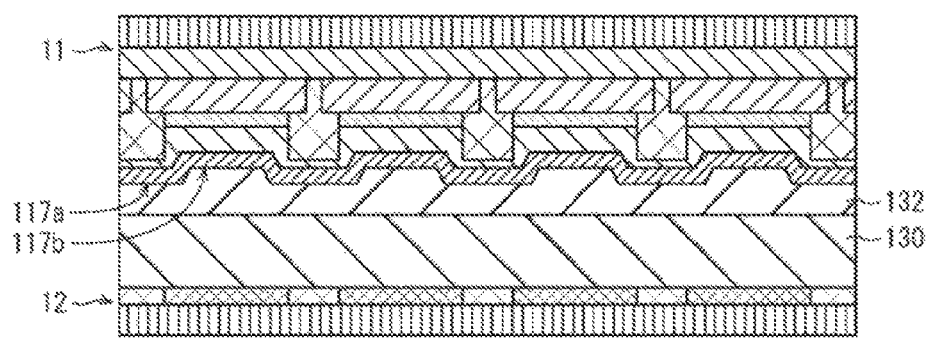

(vi) As shown in FIG. 11(a), the EL panel section 11 is adhered to a main surface 132a of the second non-fluid resin 132. This step is also carried out in a reduced-pressure atmosphere. As illustrated in FIG. 11(b), after the adhesion, the main surface 132a of the second non-fluid resin 132 is in close contact with the whole main surface including the bottom portions of the recessed sections 117b and the top portions of the projected sections 117a of the sealing layer 117 of the EL panel section 11.

Figure 11C:
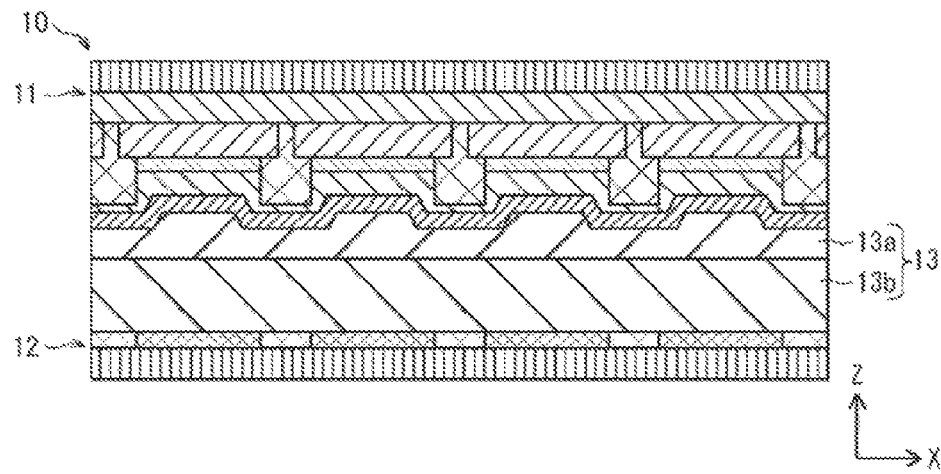

(vii) As illustrated in FIG. 11(c), in a state in which the first and second non-fluid resins 130 and 132 are sandwiched and adhered between the EL panel section 11 and the CF panel section 12, the first and second non-fluid resins 130 and 132 are irradiated with light (e.g., UV light) to impart fluidity to the resins, after which the resins are cured. By this, the first sealing resin layer 13a and the second sealing resin layer 13b are formed respectively from the first non-fluid resin 130 and the second non-fluid resin 132. As a result, the sealing resin layer 13 including the first sealing resin layer 13a and the second sealing resin layer 13b is formed. By this, the display panel 10 is completed. Note that depending on the resins used, curing is conducted by heating.

In this embodiment, the viscosity of the second non-fluid resin 132 is set to be lower than the viscosity of the first non-fluid resin 130, so that the shearing force exerted on each layer of the EL panel section 11 when the fluidity is imparted to the resins in the above step (iv) can be reduced. As a result, generation of film exfoliation arising from the shearing force can be restrained.

Embodiment 2

A general configuration of a display panel 10A according to Embodiment 2 will be described referring to FIG. 12.

The display panel 10A differs from the display panel 10 according to Embodiment 1 in the configurations of a CF panel section 12A and a sealing resin layer 13A.

Specifically, the upper surface of a CF layer 124 is formed to be higher than the upper surface of a BM layer 123, whereby not only the main surface of the EL panel section 11 but also the Z-axis-directionally upper-side main surface of the CF panel section 12A is provided with a projected and recessed shape as a whole, wherein top portions of projected sections are protruding toward the side of the EL panel section 11 more than bottom portions of recessed sections.

In addition, the sealing resin layer 13A according to this embodiment has a three-layer structure including a first sealing resin layer 13c, a second sealing resin layer 13d and a third sealing resin layer 13e. The first sealing resin layer 13c is sheet-shaped, is disposed between the EL panel section 11 and the CF panel section 12A, and does not make contact with the Z-axis-directionally lower-side main surface of the EL panel section 11, but makes contact with the Z-axis-directionally upper-side main surface of the CF panel section 12A. The second sealing resin layer 13d is sheet-shaped, is disposed between the first sealing resin layer 13c and the EL panel section 11, and makes contact with at least the first sealing resin layer 13c. In this embodiment, the second sealing resin layer 13d makes contact with the first sealing resin layer 13c, but is not in contact with the Z-axis-directionally lower-side main surface of the EL panel section 11. The third sealing resin layer 13e is sheet-shaped, is disposed between the second sealing resin layer 13d and the EL panel section 11, and makes contact with both the second sealing resin layer 13d and the Z-axis-directionally lower-side main surface of the EL panel section 11. Besides, the viscosities of the raw material of the first sealing resin layer 13c and the raw material of the third sealing resin layer 13e are lower than the viscosity of the raw material of the second sealing resin layer 13d. Note that a non-fluid resin as the raw material of the first sealing resin layer 13c is a first non-fluid resin, a non-fluid resin as the raw material of the second sealing resin layer 13d is a second non-fluid resin, and a non-fluid resin as the raw material of the third sealing resin layer 13e is a third non-fluid resin.

By such a configuration, an effect of restraining generation of film exfoliation can be obtained also in the CF panel section 12A. Specifically, film exfoliation in regard of the CF layer 124 and the BM layer 123 can be prevented, and display quality of the display panel can be enhanced. Note that this effect can be obtained by the configuration in which the viscosity of the first non-fluid resin is lower than the viscosity of the second non-fluid resin.

In addition, those regions of the CF panel section 12A which correspond to non-light-emitting regions of the EL panel section 11 in the case of viewing the EL panel section 11 and the CF panel section 12A in plan view are defined as non-light-emission corresponding regions. In this case, the recessed sections of the Z-axis-directionally upper-side main surface (second main surface) of the CF panel section 12A are provided in the non-light-emission corresponding regions.

Note that the projected sections of the Z-axis-directionally upper-side main surface (second main surface) of the CF panel section 12A may be provided in the non-light-emission corresponding regions.

Note that the difference between the viscosity of the third non-fluid resin and the viscosity of the first non-fluid resin is preferably not less than 1,000 Pa·s. By this, generation of film exfoliation due to the shearing force can be restrained.

In addition, the viscosity of the third non-fluid resin is preferably not less than 15,000 Pa·s. In this case, also, generation of film exfoliation due to the shearing force can be restrained.

Embodiment 3

Figure 13:
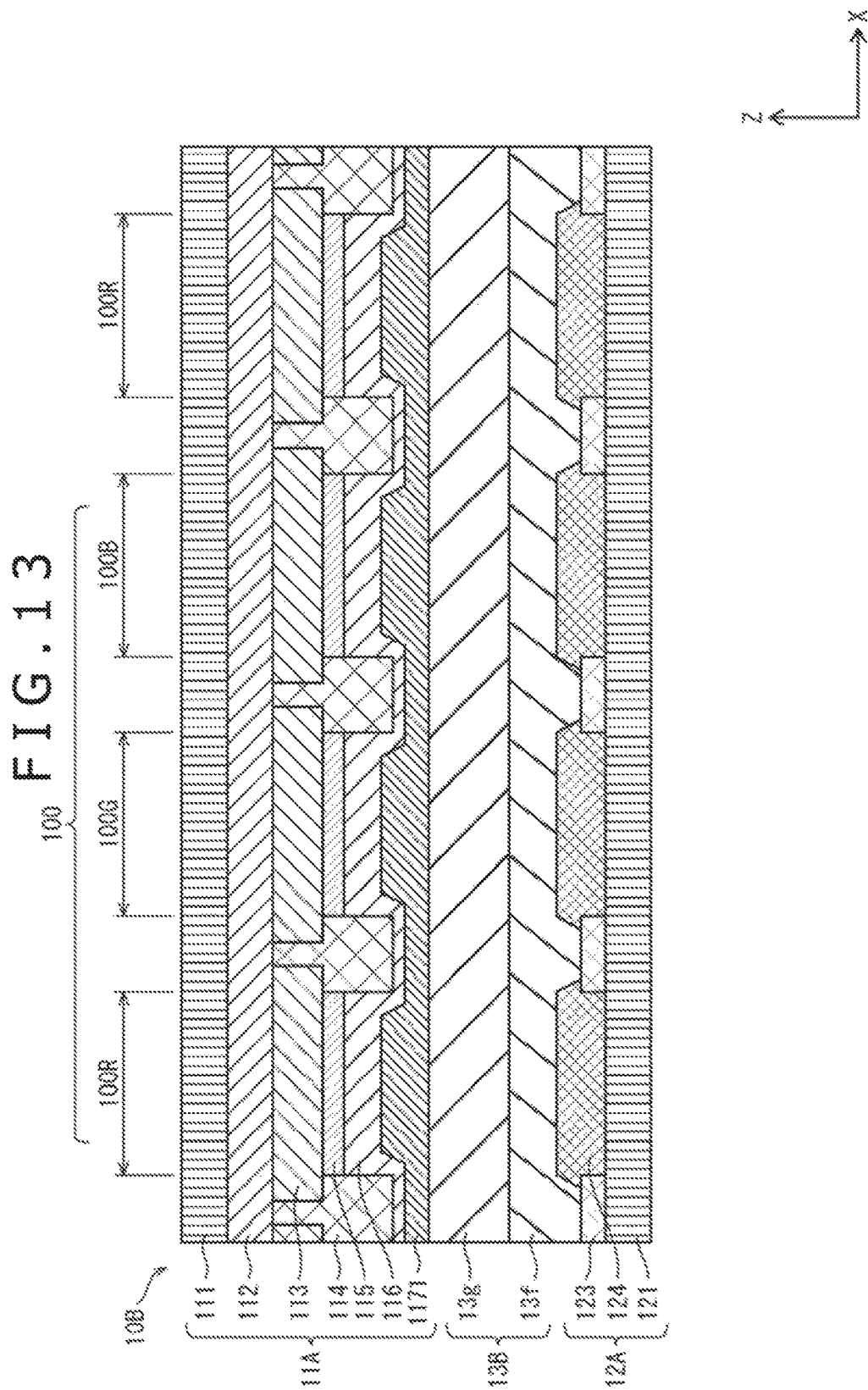
FIG. 13 is a schematic sectional view showing the configuration of a display panel 10B according to Embodiment 3.

A general configuration of a display panel 10B according to Embodiment 3 will be described referring to FIG. 13. The display panel 10B differs from the display panel 10 according to Embodiment 1 in the configurations of all of the EL panel section 11A, the CF panel section 12A and a sealing resin layer 13B.

A sealing layer 1171 of the EL panel section 11A has its surface formed to be flat, unlike in Embodiment 1, so that the Z-axis-directionally lower-side main surface of the EL panel section 11A is flat. The CF panel section 12A has the same configuration as in Embodiment 2, and its Z-axis-directionally upper-side main surface has a projected and recessed shape.

The sealing resin layer 13B according to this embodiment has a two-layer structure of a first sealing resin layer 13f and a second sealing resin layer 13g. The first sealing resin layer 13f is disposed between the EL panel section 11A and the CF panel section 12A, and does not make contact with the Z-axis-directionally lower-side main surface of the EL panel section 11A, but makes contact with the Z-axis-directionally upper-side main surface of the CF panel section 12A. The second sealing resin layer 13g is disposed between the EL panel section 11A and the first sealing resin layer 13f, and is in contact with both the first sealing resin layer 13f and the Z-axis-directionally lower-side main surface of the EL panel section 11A. The viscosity of the raw material of the viscosity of the raw material of the first sealing resin layer 13f is lower than the viscosity of the raw material of the second sealing resin layer 13g.

By such a configuration, also, film exfoliation in regard of the CF layer 124 and the BM layer 123 can be prevented, and display quality of the display panel can be enhanced, like in Embodiment 2.

[Modification]

Figure 14A:
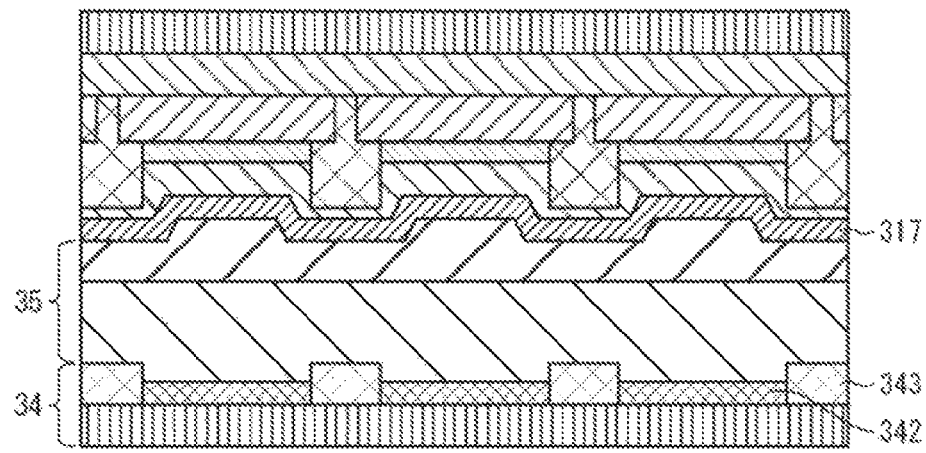
FIG. 14(a) is a schematic sectional view showing the configuration of a display panel according to a modification in which the height of a CF layer is smaller than the height of a BM layer.

In Modification illustrated in FIG. 14(a), the height of a CF layer 342 is lower than the height of a BM layer 343 in a CF panel section 34, and a main surface of the CF panel section 34 that makes contact with a sealing resin layer 35 has a projected and recessed shape as a whole. Further, in Modification shown in FIG. 14(b), the height of a CF layer 362 is higher than the height of a BM layer 363 in a CF panel section 36, and a main surface of the CF panel section 36 that makes contact with a sealing resin layer 37 has a projected and recessed shape as a whole.

Figure 14B:
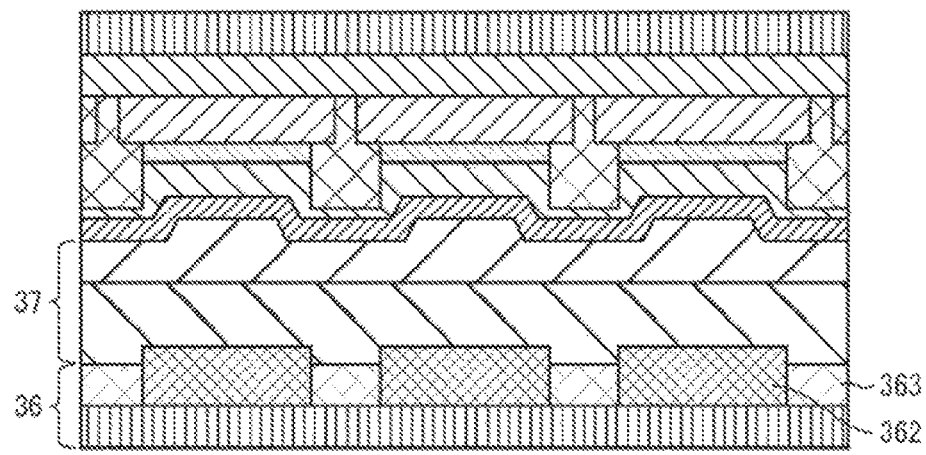
FIG. 14(b) is a schematic sectional view showing the configuration of a display panel according to a modification in which the height of a CF layer is greater than the height of a BM layer.

In the configurations of Modifications shown in FIGS. 14(a) and 14(b), also, generation of film exfoliation can be restrained.

[Other Items]

While an organic EL display panel of the so-called top emission structure has been adopted as an example in the above Embodiments and the like, the present invention is not limited to this, and the above-described configuration can be adopted also for an organic EL display device of the bottom emission structure.

In addition, the shapes of members and the constituent materials and the like shown in the above Embodiments are mere examples, and the present invention is not limited to these examples. For instance, while one of the two panel sections is the CF panel section in the above Embodiments and the like, the one may not necessarily be a CF panel section formed with a color filter layer. For example, it may be a substrate composed of glass or resin or the like.

Besides, while a configuration wherein a plurality of light-emitting regions (sub-pixels) are arranged in a matrix pattern in plan view was adopted in the above Embodiments, as shown in FIG. 2 and the like, the arrangement form of the light-emitting regions in the present invention is not limited to this. For instance, an arrangement form of a honeycomb configuration may also be adopted.

In addition, while an example wherein one mode of the present invention is applied to a pixel bank in which the periphery of each sub-pixel is surrounded by a bank formed in a pattern of two pairs of parallel lines crisscrossing each other (in a grid pattern) has been described in the above Embodiments, this is not restrictive. One mode of the present invention is also applicable to a line bank in which each of sub-pixels is partitioned in a stripe pattern.

Besides, the non-fluid resins have been irradiated with light (e.g., UV light) to impart fluidity to the resins in the above Embodiment, this is not limitative. For example, fluidity may be imparted to the non-fluid resins by heating the resins.

In addition, the step of adhering the EL panel section and the CF panel section to each other through the non-fluid resin may not necessarily be carried out in a reduced-pressure atmosphere. For instance, a method may be adopted wherein after adhesion is conducted in an atmospheric-pressure atmosphere or the like, a force is exerted between the EL panel section and the CF panel section, such as to eliminate a gap between the EL panel section and the non-fluid resin as well as a gap between the CF panel section and the non-fluid resin.

Furthermore, the present invention is applicable not only to the organic EL display panel but also to various display panels, and in that case, also, the same effects as above can be obtained.

INDUSTRIAL APPLICABILITY

The present invention is useful in realizing a display panel having high display quality.

REFERENCE SIGNS LIST

1 Display device
10, 10A, 10B Display panel
11 EL panel section
12, 34, 36 CF panel section
13, 13A, 13B, 35, 37 Sealing resin layer
13a, 13c First sealing resin layer
13b, 13d Second sealing resin layer
13e Third sealing resin layer
13f First sealing resin layer
13g Second sealing resin layer
20 Driving control section
21 to 24 Driving circuit
25 Control circuit
100 Pixel
100R R sub-pixel
100G G sub-pixel
100B B sub-pixel
111 TFT substrate
112 Interlayer insulating film
113 Anode
114 Bank
115 Organic light-emitting layer
115R R organic light-emitting layer
115G G organic light-emitting layer
115B B organic light-emitting layer
116 Cathode
117 Sealing layer
121 Substrate
122, 342, 362 Color filter layer
122R R color filter layer
122G G color filter layer
122B B color filter layer
123, 343, 363 Black matrix layer
130 First non-fluid resin
132 Second non-fluid resin
131a, 131b Laminate sheet
500 Mask
1130 Metallic thin film
1140 Bank material layer
1230 BM material layer

The invention claimed is:

1. A method of manufacturing a display panel, comprising:
   a step of preparing a first panel section of which a first main surface as a one-side main surface has a projected and recessed shape;
   a step of preparing a second panel section;
   a step of disposing a sheet-shaped first non-fluid resin in such a manner that a one-side main surface thereof makes contact with a second main surface as a one-side main surface of the second panel section;
   a step of disposing a sheet-shaped second non-fluid resin in such a manner that a one-side main surface thereof makes contact with an other-side main surface of the first non-fluid resin;
   a step of disposing the first panel section in such a manner that the first main surface of the first panel section makes contact with an other-side main surface of the second non-fluid resin; and
   a step of subjecting the first and second non-fluid resins to heating or light irradiation to impart fluidity to the resins and thereafter curing the resins to thereby form first and second sealing resin layers respectively from the first and second non-fluid resins,
   wherein prior to performing the heating or light irradiation in the step of forming the first and second sealing resin layers, the viscosity of the second non-fluid resin is lower than the viscosity of the first non-fluid resin.

2. The method of manufacturing a display panel according to claim 1,
   wherein the step of disposing the first non-fluid resin and the step of disposing the first panel section are both carried out in a reduced-pressure atmosphere; and
   after both of the steps are carried out,
   the second non-fluid resin is in contact with a whole part of the first main surface of the first panel section inclusive of a top portion of a projected section and a bottom portion of a recessed section of the projected and recessed shape of the first main surface, and
   the first non-fluid resin is in contact with a whole part of the second main surface of the second panel section.

3. The method of manufacturing a display panel according to claim 1,
   wherein the difference between the viscosity of the first non-fluid resin and the viscosity of the second non-fluid resin is not less than 1,000 Pa·s.

4. The method of manufacturing a display panel according to claim 1,
   wherein the viscosity of the first non-fluid resin is not more than 35,000 Pa·s; and
   the viscosity of the second non-fluid resin is not less than 15,000 Pa·s.

5. The method of manufacturing a display panel according to claim 1,
   wherein the first panel section has a substrate, and a light-emitting region and a non-light-emitting region which are located over the substrate and are adjacent to each other in plan view; and
   a recessed section of the projected and recessed shape of the first main surface corresponds to the light-emitting region, whereas a projected section of the projected and recessed shape of the first main surface corresponds to the non-light-emitting region.

6. The method of manufacturing a display panel according to claim 1,
   wherein the second main surface of the second panel section is flatter than the first main surface of the first panel section.

7. A method of manufacturing a display panel, comprising:
   a step of preparing a first panel section of which a first main surface as a one-side main surface has a projected and recessed shape;
   a step of preparing a second panel section;

a step of disposing a sheet-shaped first non-fluid resin in such a manner that a one-side main surface thereof makes contact with a second main surface as a one-side main surface of the second panel section;

a step of disposing a sheet-shaped second non-fluid resin in such a manner that a one-side main surface thereof makes contact with an other-side main surface of the first non-fluid resin;

a step of disposing a sheet-shaped third non-fluid resin in such a manner that a one-side main surface thereof makes contact with an other-side main surface of the second non-fluid resin;

a step of disposing the first panel section in such a manner that the first main surface thereof makes contact with an other-side main surface of the third non-fluid resin; and a step of subjecting the first, second and third non-fluid resins to heating or light irradiation to impart fluidity to the resins and thereafter curing the resins to thereby form first, second and third sealing resin layers respectively from the first, second and third non-fluid resins, wherein prior to performing the heating or light irradiation in the step of forming the first, second and third sealing resin layers, the viscosity of the second non-fluid resin is higher than the viscosities of the first non-fluid resin and the third non-fluid resin.

8. The method of manufacturing a display panel according to claim 7,
wherein the difference between the viscosity of the second non-fluid resin and the viscosities of the first non-fluid resin and the third non-fluid resin is not less than 1,000 Pa·s.

9. The method of manufacturing a display panel according to claim 7,
wherein the viscosity of the second non-fluid resin is not more than 35,000 Pa·s.

10. The method of manufacturing a display panel according to claim 7,
wherein the first panel section has a substrate, and a light-emitting region and a non-light-emitting region which are located over the substrate and are adjacent to each other in plan view; and
a recessed section of the projected and recessed shape of the first main surface corresponds to the light-emitting region, whereas a projected section of the projected and recessed shape of the first main surface corresponds to the non-light-emitting region.

* * * * *